(12) United States Patent
Ohsawa et al.

(10) Patent No.: US 12,376,302 B2
(45) Date of Patent: Jul. 29, 2025

(54) SEMICONDUCTOR MEMORY DEVICE AND METHOD FOR MANUFACTURING SEMICONDUCTOR MEMORY DEVICE

(71) Applicant: Kioxia Corporation, Tokyo (JP)

(72) Inventors: Saho Ohsawa, Yokkaichi (JP); Kenichi Fujii, Yokkaichi (JP); Takashi Fukushima, Yokkaichi (JP); Hiroyuki Ohtori, Yokkaichi (JP); Kaihei Katou, Yokkaichi (JP); Masaki Kato, Yokkaichi (JP); Ryosuke Sawabe, Yokkaichi (JP); Yuji Sakai, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 338 days.

(21) Appl. No.: 17/806,111

(22) Filed: Jun. 9, 2022

(65) Prior Publication Data
US 2023/0301088 A1   Sep. 21, 2023

(30) Foreign Application Priority Data

Mar. 18, 2022  (JP) ................. 2022-043357

(51) Int. Cl.
   H10D 64/68    (2025.01)
   H10B 43/27    (2023.01)
   H10D 30/69    (2025.01)

(52) U.S. Cl.
   CPC ......... H10B 43/27 (2023.02); H10D 30/694 (2025.01); H10D 64/685 (2025.01)

(58) Field of Classification Search
   CPC .................... H01L 29/4234; H01L 29/513
   See application file for complete search history.

(56) References Cited

U.S. PATENT DOCUMENTS

| 10,916,504 B2 | 2/2021 | Mukae et al. |
| 2020/0119047 A1* | 4/2020 | Yoo ............... H01L 29/40111 |
| 2022/0139960 A1* | 5/2022 | Said .................. H10B 51/30 |
| | | 257/295 |

* cited by examiner

*Primary Examiner* — Mohammad M Choudhry
(74) *Attorney, Agent, or Firm* — Oblon, McClelland, Maier & Neustadt, L.L.P.

(57) ABSTRACT

A semiconductor memory device of an embodiment includes: a semiconductor layer extending in a first direction; a gate electrode layer containing at least one element selected from a group consisting of molybdenum (Mo), tungsten (W), ruthenium (Ru), and cobalt (Co); a first insulating layer provided between the semiconductor layer and the gate electrode layer; a charge storage layer provided between the first insulating layer and the gate electrode layer; a second insulating layer provided between the charge storage layer and the gate electrode layer; a third insulating layer provided between the second insulating layer and the gate electrode layer; and a metal oxide layer provided between the third insulating layer and the gate electrode layer and containing at least one first metal element selected from a group consisting of titanium (Ti), molybdenum (Mo), tungsten (W), and tantalum (Ta).

14 Claims, 22 Drawing Sheets

BB' CROSS SECTION

AA' CROSS SECTION

BB' CROSS SECTION

AA' CROSS SECTION

BB' CROSS SECTION

AA' CROSS SECTION

SEMICONDUCTOR MEMORY DEVICE AND METHOD FOR MANUFACTURING SEMICONDUCTOR MEMORY DEVICE

CROSS-REFERENCE TO RELATED APPLICATION

This application is based upon and claims the benefit of priority from Japanese Patent Application No. 2022-043357, filed on Mar. 18, 2022, the entire contents of which are incorporated herein by reference.

FIELD

Embodiments described herein relate generally to a semiconductor memory device and a method for manufacturing a semiconductor memory device.

BACKGROUND

A three-dimensional NAND flash memory in which memory cells are three-dimensionally disposed achieves high integration and low cost. In the three-dimensional NAND flash memory, for example, a stacked body in which a plurality of insulating layers and a plurality of gate electrode layers are alternately stacked is provided with a memory hole penetrating the stacked body. By forming a charge storage layer and a semiconductor layer in the memory hole, a memory string in which a plurality of memory cells are connected in series is formed. Data is stored in the memory cell by controlling the amount of charge retained in the charge storage layer.

DETAILED DESCRIPTION

Figure 1:
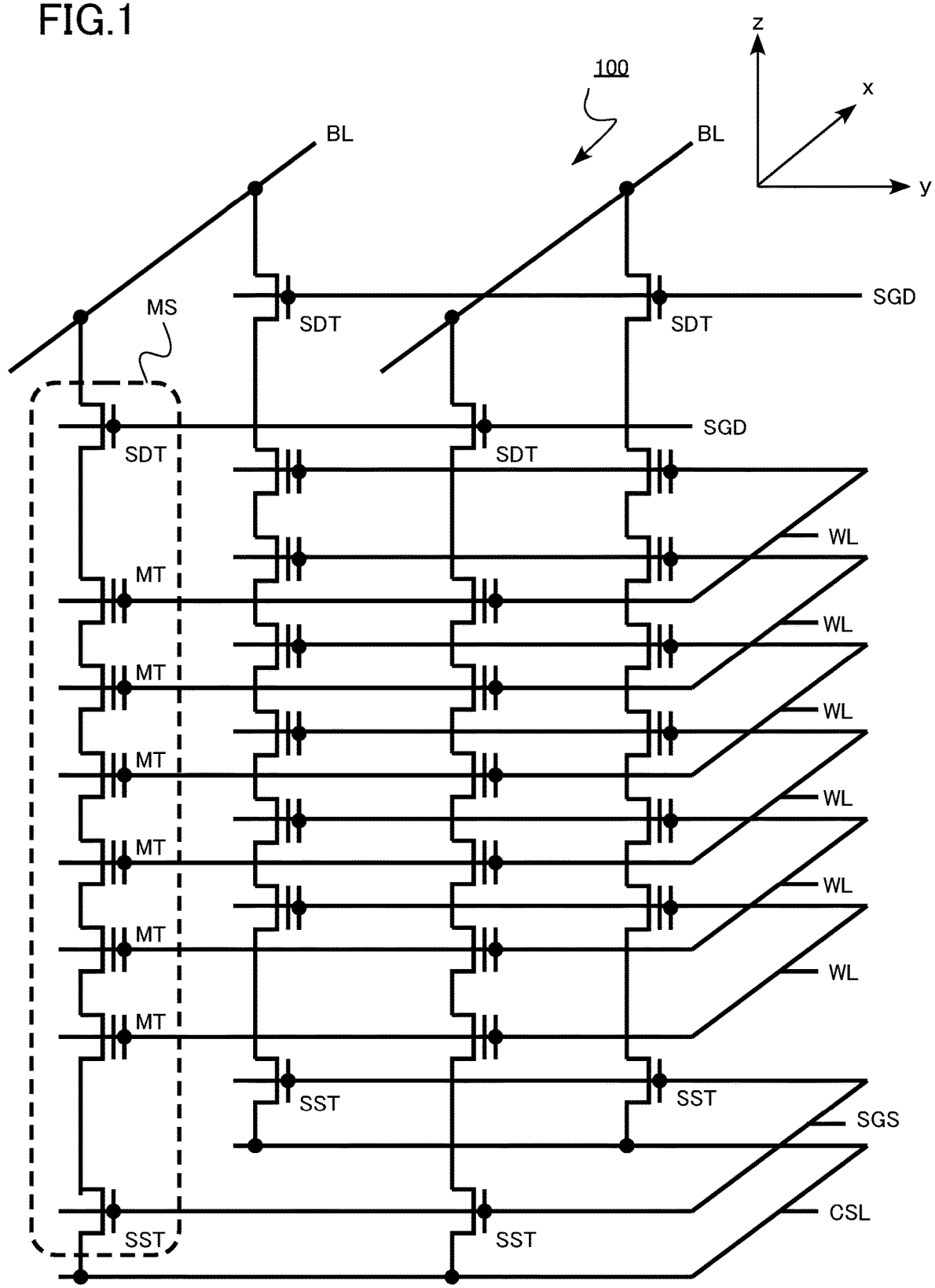
FIG. 1 is a circuit diagram of a memory cell array of a semiconductor memory device of a first embodiment.

A semiconductor memory device of an embodiment includes: a semiconductor layer extending in a first direction; a gate electrode layer containing at least one element selected from a group consisting of molybdenum (Mo), tungsten (W), ruthenium (Ru), and cobalt (Co); a first insulating layer provided between the semiconductor layer and the gate electrode layer; a charge storage layer provided between the first insulating layer and the gate electrode layer; a second insulating layer provided between the charge storage layer and the gate electrode layer; a third insulating layer provided between the second insulating layer and the gate electrode layer; and a metal oxide layer provided between the third insulating layer and the gate electrode layer and containing at least one first metal element selected from a group consisting of titanium (Ti), molybdenum (Mo), tungsten (W), and tantalum (Ta).

Embodiments of the present disclosure will be described below with reference to the drawings. In the following description, identical or similar members and the like are given identical numerals, and the description of the members and the like explained once will be omitted as appropriate.

In the present description, the term "above" or "below" may be used for convenience. The term "above" or "below" is, for example, a term indicating a relative positional relationship in the drawings. The term "above" or "below" is not a term defining a positional relationship with respect to gravity.

Qualitative analysis and quantitative analysis of the chemical composition of the members constituting the semiconductor memory device in the present description can be carried out by, for example, secondary ion mass spectroscopy (SIMS), energy dispersive X-ray spectroscopy (EDX), electron energy loss spectroscopy (EELS), or the like. For example, a transmission electron microscope (TEM) can be used to measure the thickness of the members constituting the semiconductor memory device, the distance between the members, and the like. For identification of the crystal systems of constituent substances of the members constituting the semiconductor memory device and comparison of the abundance ratio of the crystal systems, it is possible to use, for example, a transmission electron microscope, X-ray diffraction (XRD), electron beam diffraction (EBD), X-ray photoelectron spectroscopy (XPS), or synchrotron radiation X-ray absorption fine structure (XAFS). It is possible to determine, from an image obtained by TEM, for example, whether a member constituting the semiconductor memory device is crystalline or amorphous.

First Embodiment

The semiconductor memory device of the first embodiment includes: a semiconductor layer extending in a first direction; a gate electrode layer containing at least one element selected from a group consisting of molybdenum (Mo), tungsten (W), ruthenium (Ru), and cobalt (Co); a first insulating layer provided between the semiconductor layer and the gate electrode layer; a charge storage layer provided between the first insulating layer and the gate electrode layer; a second insulating layer provided between the charge storage layer and the gate electrode layer; a third insulating layer provided between the second insulating layer and the gate electrode layer; and a metal oxide layer provided between the third insulating layer and the gate electrode layer and containing at least one first metal element selected from a group consisting of titanium (Ti), molybdenum (Mo), tungsten (W), and tantalum (Ta).

The semiconductor memory device of the first embodiment is a three-dimensional NAND flash memory. The memory cell of the semiconductor memory device of the first embodiment is a memory cell of so-called metal-oxide-nitride-oxide-semiconductor type (MONOS type).

FIG. 1 is a circuit diagram of the memory cell array of the semiconductor memory device of the first embodiment.

As illustrated in FIG. 1, a memory cell array 100 of the three-dimensional NAND flash memory of the first embodiment includes a plurality of word lines WL, a common source line CSL, a source selection gate line SGS, a plurality of drain selection gate lines SGD, a plurality of bit lines BL, and a plurality of memory strings MS.

The plurality of word lines WL are disposed in the z direction while being separated from one another. The plurality of word lines WL are stacked and disposed in the z direction. The plurality of memory strings MS extend in the z direction. The plurality of bit lines BL extend in the x direction, for example.

Hereinafter, the x direction is defined as a third direction, the y direction is defined as a second direction, and the z direction is defined as a first direction. The x direction, the y direction, and the z direction intersect one another, and are perpendicular to one another, for example.

As illustrated in FIG. 1, the memory string MS includes a source selection transistor SST, a plurality of memory cells, and a drain selection transistor SDT, which are connected in series between the common source line CSL and the bit line BL. One memory string MS is selected by selecting one bit line BL and one drain selection gate line SGD, and one memory cell can be selected by selecting one word line WL. The word line WL is a gate electrode of a memory cell transistor MT constituting the memory cell.

Figure 2A:
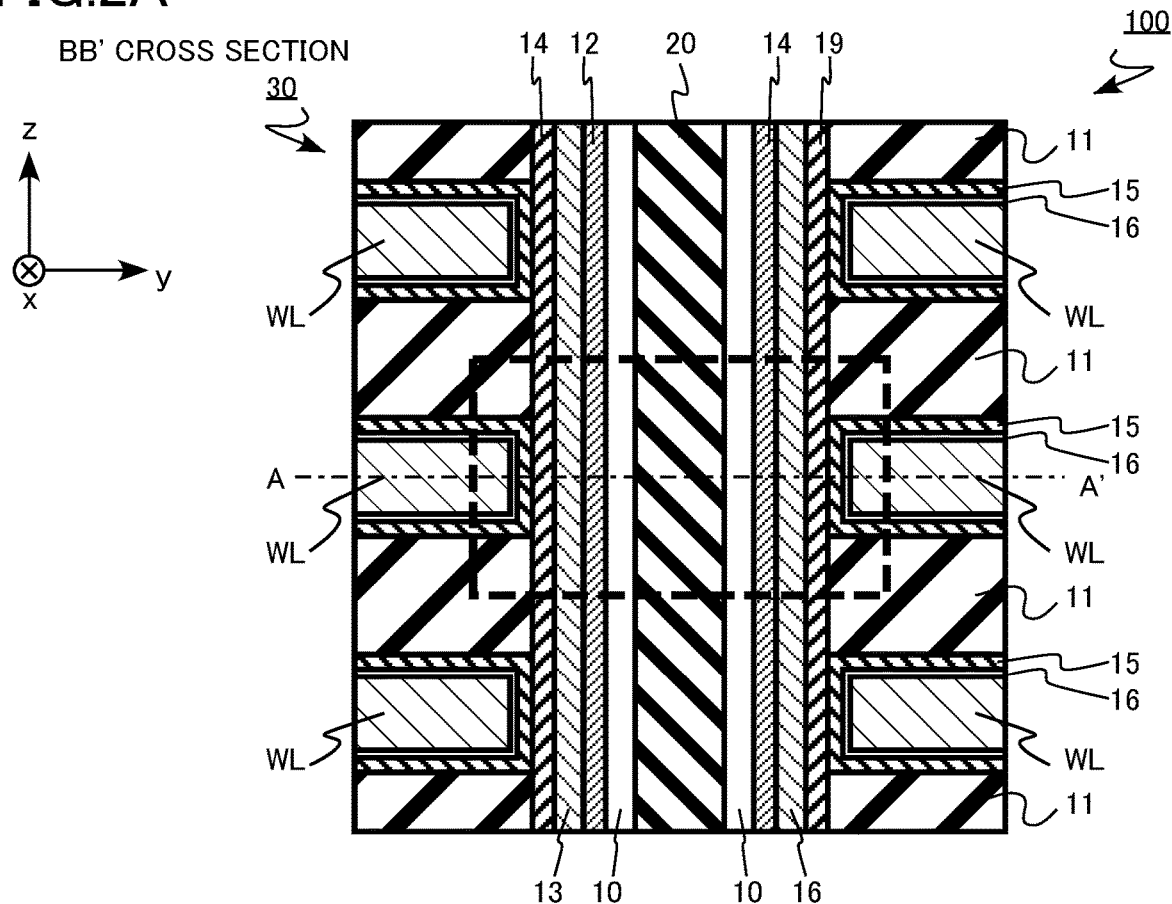
FIG. 2A is a schematic cross-sectional view of the memory cell array of the semiconductor memory device of the first embodiment.
Figure 2B:
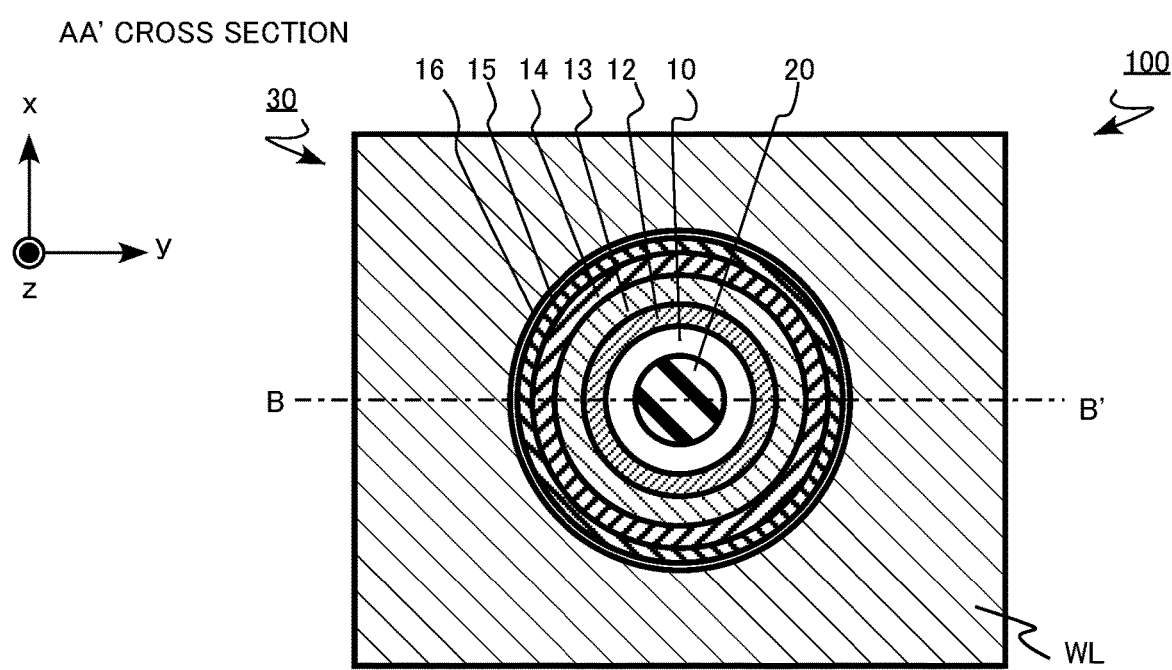
FIG. 2B is a schematic cross-sectional view of the memory cell array of the semiconductor memory device of the first embodiment.

FIGS. 2A and 2B are schematic cross-sectional views of the memory cell array of the semiconductor memory device of the first embodiment. FIGS. 2A and 2B illustrate a cross section of a plurality of memory cells in one memory string MS enclosed by a dotted line, for example, in the memory cell array 100 of FIG. 1.

FIG. 2A is a yz cross-sectional view of the memory cell array 100. FIG. 2A is a BB' cross section of FIG. 2B. FIG. 2B is an xy cross-sectional view of the memory cell array 100. FIG. 2B is an AA' cross section of FIG. 2A. In FIG. 2A, a region enclosed by a broken line is one memory cell.

Figure 3:
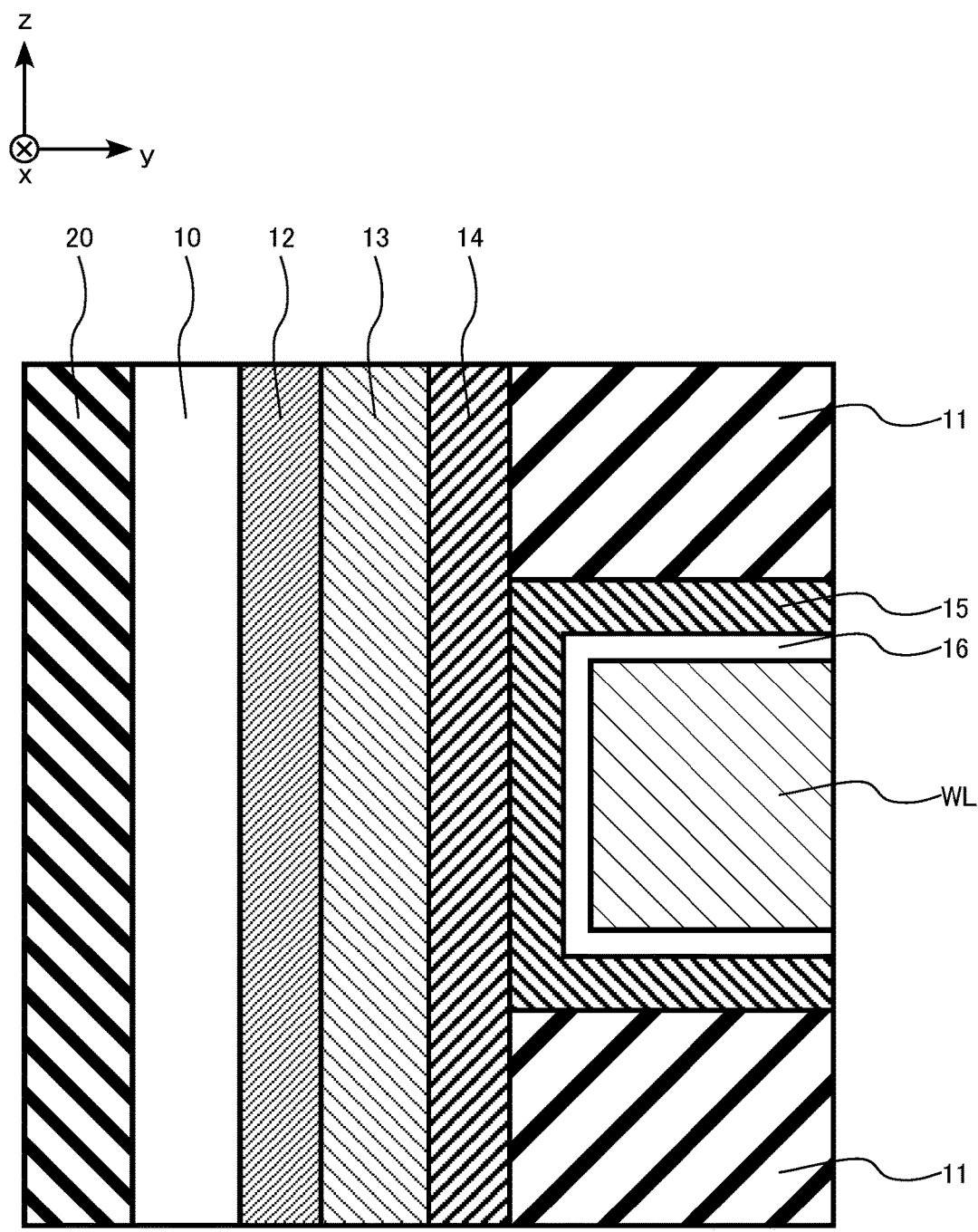
FIG. 3 is a schematic cross-sectional view of a memory cell of the semiconductor memory device of the first embodiment.

FIG. 3 is a schematic cross-sectional view of the memory cell of the semiconductor memory device of the first embodiment. FIG. 3 is an enlarged cross-sectional view of a part of the memory cell.

As illustrated in FIGS. 2A, 2B, and 3, the memory cell array 100 includes the word line WL, a semiconductor layer 10, an interlayer insulating layer 11, a tunnel insulating layer 12, a charge storage layer 13, a first block insulating layer 14, a second block insulating layer 15, a metal oxide layer 16, and a core insulating region 20.

The plurality of word lines WL and the plurality of interlayer insulating layers 11 constitute a stacked body 30.

The word line WL is an example of the gate electrode layer. The tunnel insulating layer 12 is an example of the first insulating layer. The first block insulating layer 14 is an example of the second insulating layer. The second block insulating layer 15 is an example of the third insulating layer.

The memory cell array 100 is provided on a semiconductor substrate not illustrated, for example. The semiconductor substrate has a surface parallel to the x direction and the y direction.

The word lines WL and the interlayer insulating layers 11 are alternately stacked in the z direction on the semiconductor substrate. The word lines WL are repeatedly disposed apart from one another in the z direction. The plurality of word lines WL and the plurality of interlayer insulating layers 11 constitute a stacked body 30. The word line WL functions as a control electrode of the memory cell transistor MT.

The word line WL is a plate-like conductor. The word line WL contains at least one element selected from a group consisting of molybdenum (Mo), tungsten (W), ruthenium (Ru), and cobalt (Co). The word line WL has at least one element selected from a group consisting of molybdenum (Mo), tungsten (W), ruthenium (Ru), and cobalt (Co) as a main component.

The word line WL has molybdenum (Mo), tungsten (W), ruthenium (Ru), or cobalt (Co) as a main component. For example, that the word line WL has molybdenum (Mo) as a main component means that an element having an atomic concentration higher than that of molybdenum (Mo) does not exist among the elements contained in the word line WL.

The word line WL is, for example, a molybdenum layer, a tungsten layer, a ruthenium layer, or a cobalt layer. The thickness of the word line WL in the z direction is, for example, equal to or more than 5 nm and equal to or less than 20 nm.

The interlayer insulating layer 11 separates the word line WL from the word line WL. The interlayer insulating layer 11 electrically separates the word line WL from the word line WL.

The interlayer insulating layer 11 is, for example, an oxide, an oxynitride, or a nitride. The interlayer insulating layer 11 contains, for example, silicon oxide. The interlayer insulating layer 11 is, for example, a silicon oxide layer. The thickness of the interlayer insulating layer 11 in the z direction is, for example, equal to or more than 5 nm and equal to or less than 20 nm.

The semiconductor layer 10 is provided in the stacked body 30. The semiconductor layer 10 extends in the z direction. The semiconductor layer 10 extends in a direction perpendicular to the surface of the semiconductor substrate.

The semiconductor layer 10 is provided to penetrate the stacked body 30. The semiconductor layer 10 is surrounded by the plurality of word lines WL. The semiconductor layer 10 has a cylindrical shape, for example. The semiconductor layer 10 functions as a channel of the memory cell transistor MT.

The semiconductor layer 10 is, for example, a polycrystalline semiconductor. The semiconductor layer 10 is, for example, polycrystalline silicon.

The tunnel insulating layer 12 is provided between the semiconductor layer 10 and the word line WL. The tunnel insulating layer 12 is provided between the semiconductor layer 10 and at least one of the plurality of word lines WL. The tunnel insulating layer 12 is provided between the semiconductor layer 10 and the charge storage layer 13. The tunnel insulating layer 12 has a function of passing charges according to a voltage applied between the word line WL and the semiconductor layer 10.

The tunnel insulating layer 12 contains, for example, silicon (Si), nitrogen (N), and oxygen (O). The tunnel insulating layer 12 includes, for example, silicon oxide, silicon nitride, or silicon oxynitride. The tunnel insulating layer 12 has a stacked structure of, for example, a silicon oxide layer, a silicon nitride layer, and a silicon oxide layer. The thickness of the tunnel insulating layer 12 is, for example, equal to or more than 3 nm and equal to or less than 8 nm.

The charge storage layer 13 is provided between the tunnel insulating layer 12 and the word line WL. The charge storage layer 13 is provided between the tunnel insulating layer 12 and the first block insulating layer 14. The charge storage layer 13 is provided between the tunnel insulating layer 12 and the second block insulating layer 15.

The charge storage layer 13 has a function of trapping and storing charges. The charge is, for example, an electron. The threshold voltage of the memory cell transistor MT changes according to the amount of charges stored in the charge storage layer 13. Use of this threshold voltage change enables one memory cell to store data.

For example, when the threshold voltage of the memory cell transistor MT changes, the voltage at which the memory cell transistor MT is turned on changes. For example, when a state in which the threshold voltage is high is defined as data "0" and a state in which the threshold voltage is low is defined as data "1", the memory cell can store 1-bit data of "0" and "1".

The charge storage layer 13 is an insulating layer. The charge storage layer 13 contains, for example, silicon (Si) and nitrogen (N). The charge storage layer 13 contains, for example, silicon nitride. The charge storage layer 13 is, for example, a silicon nitride layer. The thickness of the charge storage layer 13 is, for example, equal to or more than 3 nm and equal to or less than 10 nm.

The first block insulating layer 14 is provided between the charge storage layer 13 and the word line WL. The first block insulating layer 14 is provided between the charge storage layer 13 and the second block insulating layer 15. The first block insulating layer 14 has a function of blocking a current flowing between the charge storage layer 13 and the word line WL.

The first block insulating layer 14 contains a first element and oxygen (O). The first block insulating layer 14 has the first element and oxygen (O) as main components. That the first block insulating layer 14 has the first element and oxygen (O) as main components means that an element having an atomic concentration higher than that of the first element or oxygen (O) does not exist other than the first element and oxygen (O) among the elements contained in the first block insulating layer 14.

The first element is, for example, silicon (Si) or aluminum (Al). The first block insulating layer 14 contains, for example, silicon oxide or aluminum oxide. The first block insulating layer 14 is, for example, a silicon oxide layer or an aluminum oxide layer.

The thickness of the first block insulating layer 14 in the y direction is, for example, equal to or more than 1 nm and equal to or less than 8 nm.

The second block insulating layer 15 is provided between the first block insulating layer 14 and the word line WL in the y direction. The second block insulating layer 15 is provided between the word line WL and the interlayer insulating layer 11 in the z direction. The second block insulating layer 15 has a function of blocking a current flowing between the charge storage layer 13 and the word line WL.

The second block insulating layer 15 contains a second element different from the first element, for example, and oxygen (O). The second block insulating layer 15 has, for example, the second element and oxygen (O) as main components. The second element is, for example, aluminum (Al), hafnium (Hf), or zirconium (Zr).

The second block insulating layer 15 contains, for example, aluminum oxide, hafnium oxide, or zirconium oxide. The second block insulating layer 15 is, for example, an aluminum oxide layer, a hafnium oxide layer, or a zirconium oxide layer.

The thickness of the second block insulating layer 15 in the y direction is, for example, equal to or more than 1 nm and equal to or less than 5 nm.

The metal oxide layer 16 is provided between the second block insulating layer 15 and the word line WL in the y direction. The metal oxide layer 16 is provided between the word line WL and the interlayer insulating layer 11 in the z direction. The metal oxide layer 16 is provided between the second block insulating layer 15 and the word line WL in the z direction.

The metal oxide layer 16 contains at least one first metal element selected from a group consisting of titanium (Ti), molybdenum (Mo), tungsten (W), and tantalum (Ta). The metal oxide layer 16 has, as a main component, at least one first metal element selected from a group consisting of, for example, titanium (Ti), molybdenum (Mo), tungsten (W), and tantalum (Ta).

The metal oxide layer 16 has, for example, titanium (Ti), molybdenum (Mo), tungsten (W), or tantalum (Ta) as a main component. For example, that the metal oxide layer 16 has titanium (Ti) as a main component means that an element having an atomic concentration higher than that of titanium (Ti) does not exist other than oxygen (O) among the elements contained in the metal oxide layer 16.

The metal oxide layer 16 contains, for example, titanium oxide, molybdenum oxide, tungsten oxide, or tantalum oxide. The metal oxide layer 16 contains, for example, a titanium oxide layer, a molybdenum oxide layer, a tungsten oxide layer, or a tantalum oxide layer.

The thickness of the metal oxide layer 16 in the y direction is, for example, equal to or more than 1 nm and equal to or less than 5 nm.

The core insulating region 20 is provided in the stacked body 30. The core insulating region 20 extends in the z direction. The core insulating region 20 is provided to penetrate the stacked body 30. The core insulating region 20 is surrounded by the semiconductor layer 10. The core insulating region 20 is surrounded by the plurality of word lines WL. The core insulating region 20 has a pillar shape. The core insulating region 20 has a columnar shape, for example.

The core insulating region 20 is, for example, an oxide, an oxynitride, or a nitride. The core insulating region 20 contains, for example, silicon (Si) and oxygen (O). The core insulating region 20 is, for example, silicon oxide.

Next, the method for manufacturing the semiconductor memory device of the first embodiment will be described.

The method for manufacturing a semiconductor memory device of the first embodiment includes: forming a stacked structure in which a first insulating film and a second insulating film are alternately stacked in a first direction; forming an opening in the stacked structure; sequentially forming a third insulating film, a charge storage film, a fourth insulating film, and a semiconductor film in the opening; selectively removing the second insulating film with respect to the first insulating film to expose the third insulating film; forming a fifth insulating film in a region from which the second insulating film has been removed; forming a metal oxide film containing at least one first metal element selected from a group consisting of titanium (Ti), molybdenum (Mo), tungsten (W), and tantalum (Ta) in a region from which the second insulating film has been removed; and forming a metal film containing at least one element selected from a group consisting of molybdenum (Mo), tungsten (W), ruthenium (Ru), and cobalt (Co) in a region from which the second insulating film has been removed.

An example of the method for manufacturing a semiconductor memory device of the first embodiment will be described below.

FIGS. 4, 5, 6, 7, 8, 9, 10, 11, 12, 13, 14, and 15 are schematic cross-sectional views illustrating examples of the method for manufacturing the semiconductor memory device of the first embodiment. FIGS. 4 to 15 each illustrate a cross section corresponding to FIG. 2A. FIGS. 4 to 15 are diagrams illustrating examples of a method for manufacturing the memory cell array 100 of the semiconductor memory device.

Hereinafter, a case where the word line WL is a molybdenum layer and the metal oxide layer 16 is a titanium oxide layer will be described as an example.

Figure 4:
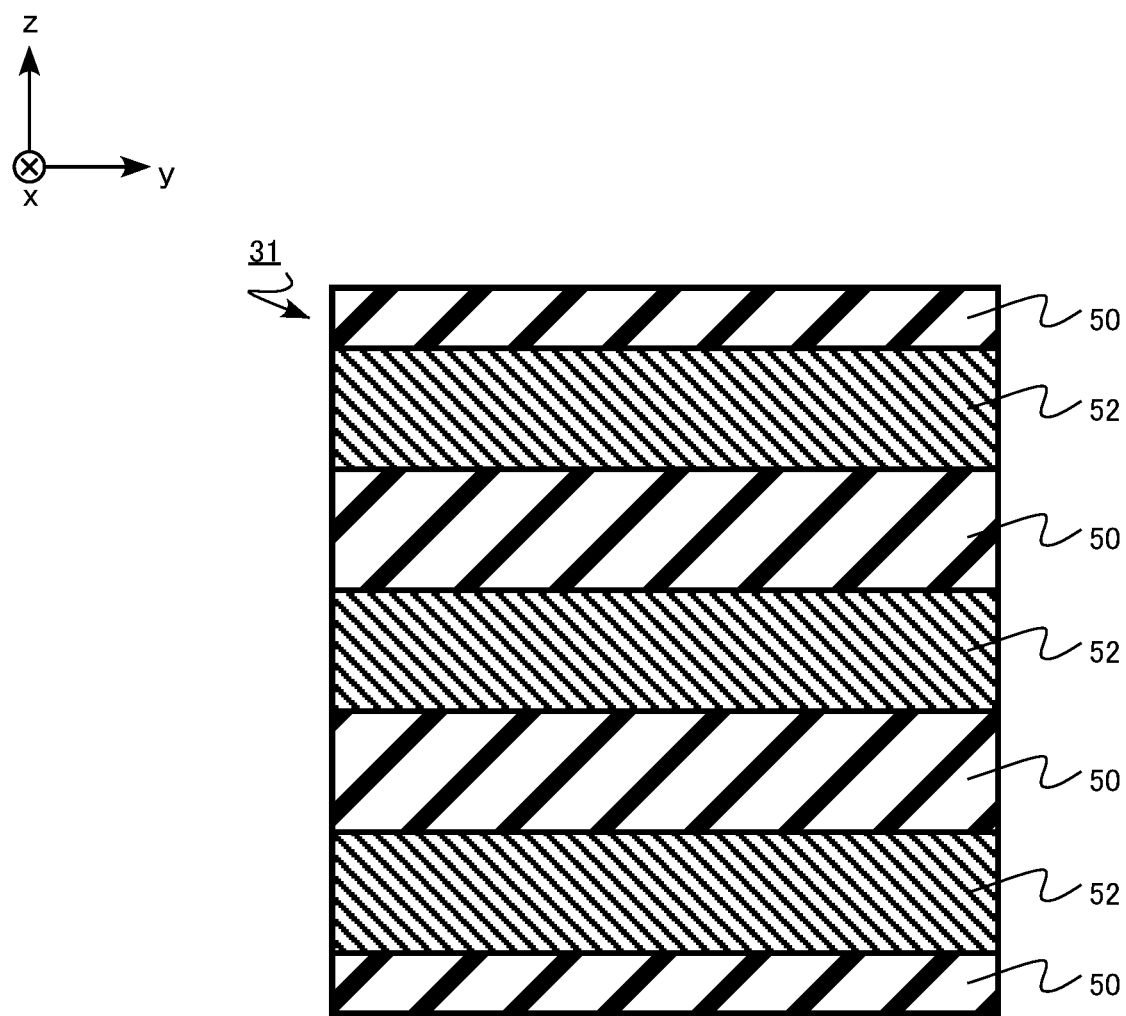
FIG. 4 is a schematic cross-sectional view illustrating an example of a method for manufacturing the semiconductor memory device of the first embodiment.

First, a first silicon oxide film 50 and a first silicon nitride film 52 are alternately stacked on a semiconductor substrate not illustrated (FIG. 4). The first silicon oxide film 50 is an example of the first insulating film. The first silicon nitride film 52 is an example of the second insulating film.

A stacked structure 31 in which the plurality of first silicon oxide films 50 and the plurality of first silicon nitride films 52 are alternately stacked in the z direction is formed. A part of the stacked structure 31 ultimately becomes the stacked body 30.

The first silicon oxide film 50 and the first silicon nitride film 52 are formed by, for example, a chemical vapor deposition method (CVD method). A part of the first silicon oxide film 50 ultimately becomes the interlayer insulating layer 11.

Figure 5:
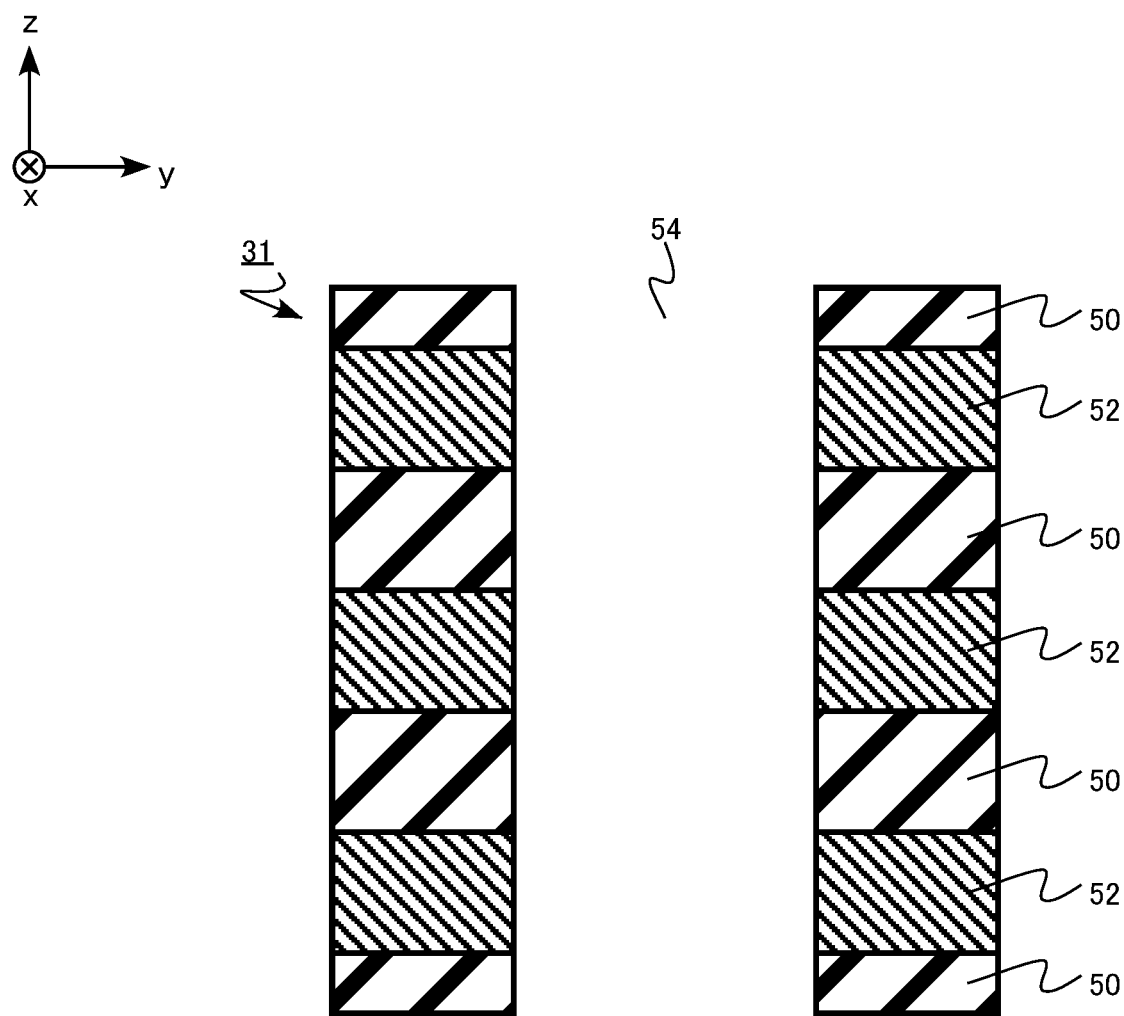
FIG. 5 is a schematic cross-sectional view illustrating an example of the method for manufacturing the semiconductor memory device of the first embodiment.

Next, a memory hole 54 is formed in the first silicon oxide film 50 and the first silicon nitride film 52 (FIG. 5). The memory hole 54 is an example of the opening.

The memory hole 54 penetrates the stacked structure 31 and extends in the z direction. The memory hole 54 is formed by, for example, a lithography method and a reactive ion etching method (RIE method).

Figure 6:
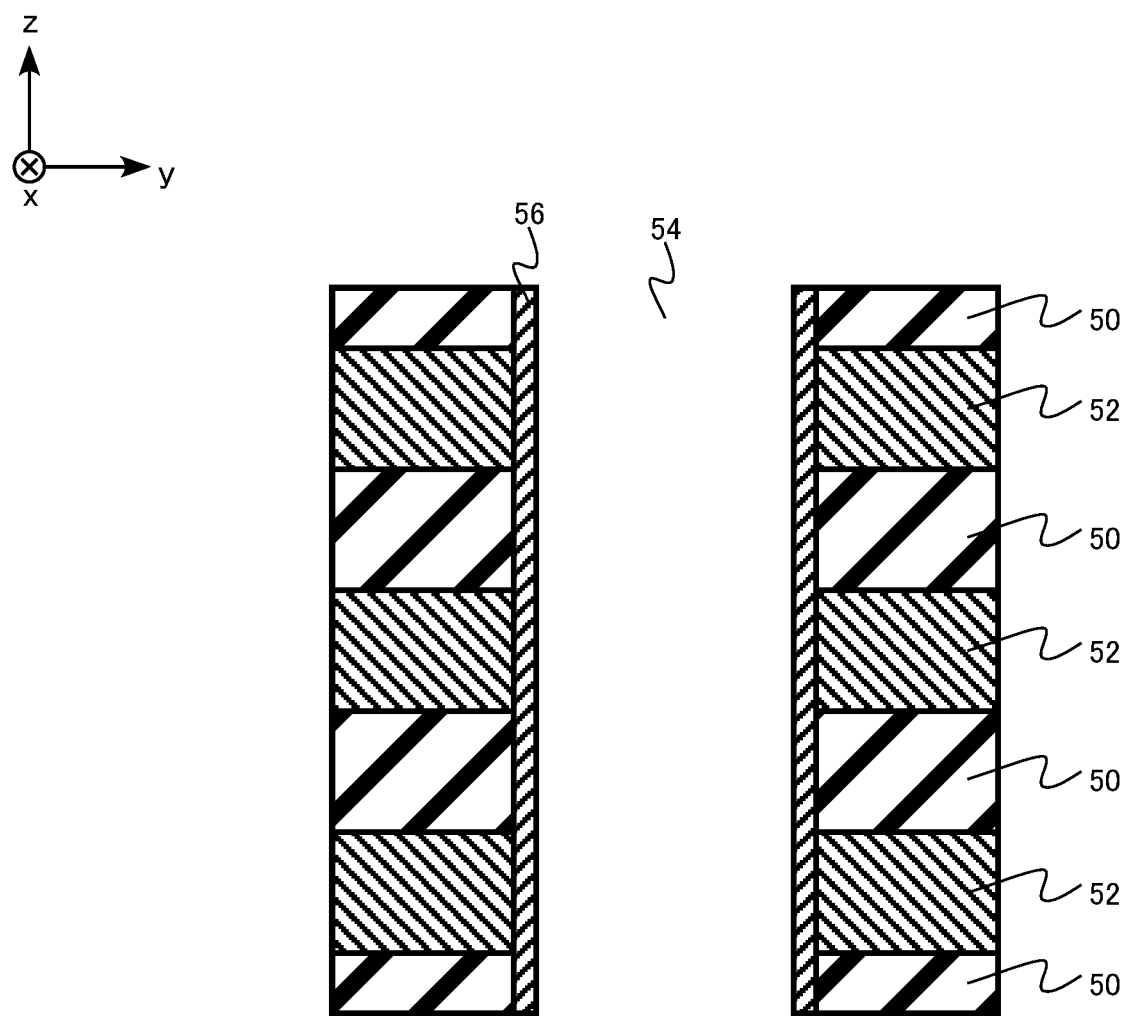
FIG. 6 is a schematic cross-sectional view illustrating an example of the method for manufacturing the semiconductor memory device of the first embodiment.

Next, a second silicon oxide film 56 is formed on the inner wall of the memory hole 54 (FIG. 6). The second silicon oxide film 56 is an example of the third insulating film. The second silicon oxide film 56 is formed by, for example, the CVD method. The second silicon oxide film 56 ultimately becomes the first block insulating layer 14.

Figure 7:
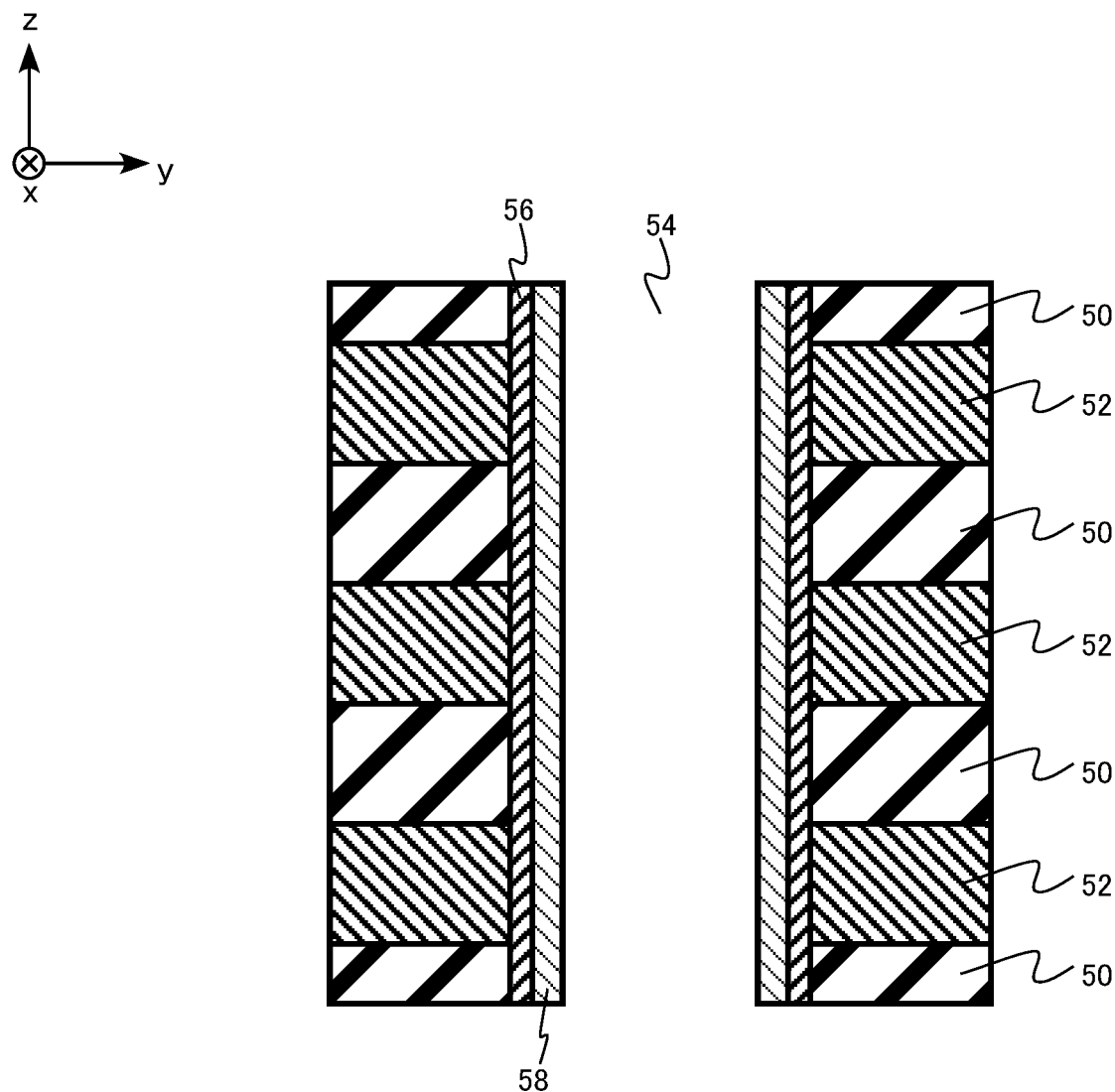
FIG. 7 is a schematic cross-sectional view illustrating an example of the method for manufacturing the semiconductor memory device of the first embodiment.

Next, a second silicon nitride film 58 is formed on the second silicon oxide film 56 (FIG. 7). The second silicon nitride film 58 is an example of the charge storage film. The second silicon nitride film 58 is formed by, for example, an atomic layer deposition method (ALD method). The second silicon nitride film 58 ultimately becomes the charge storage layer 13.

Figure 8:
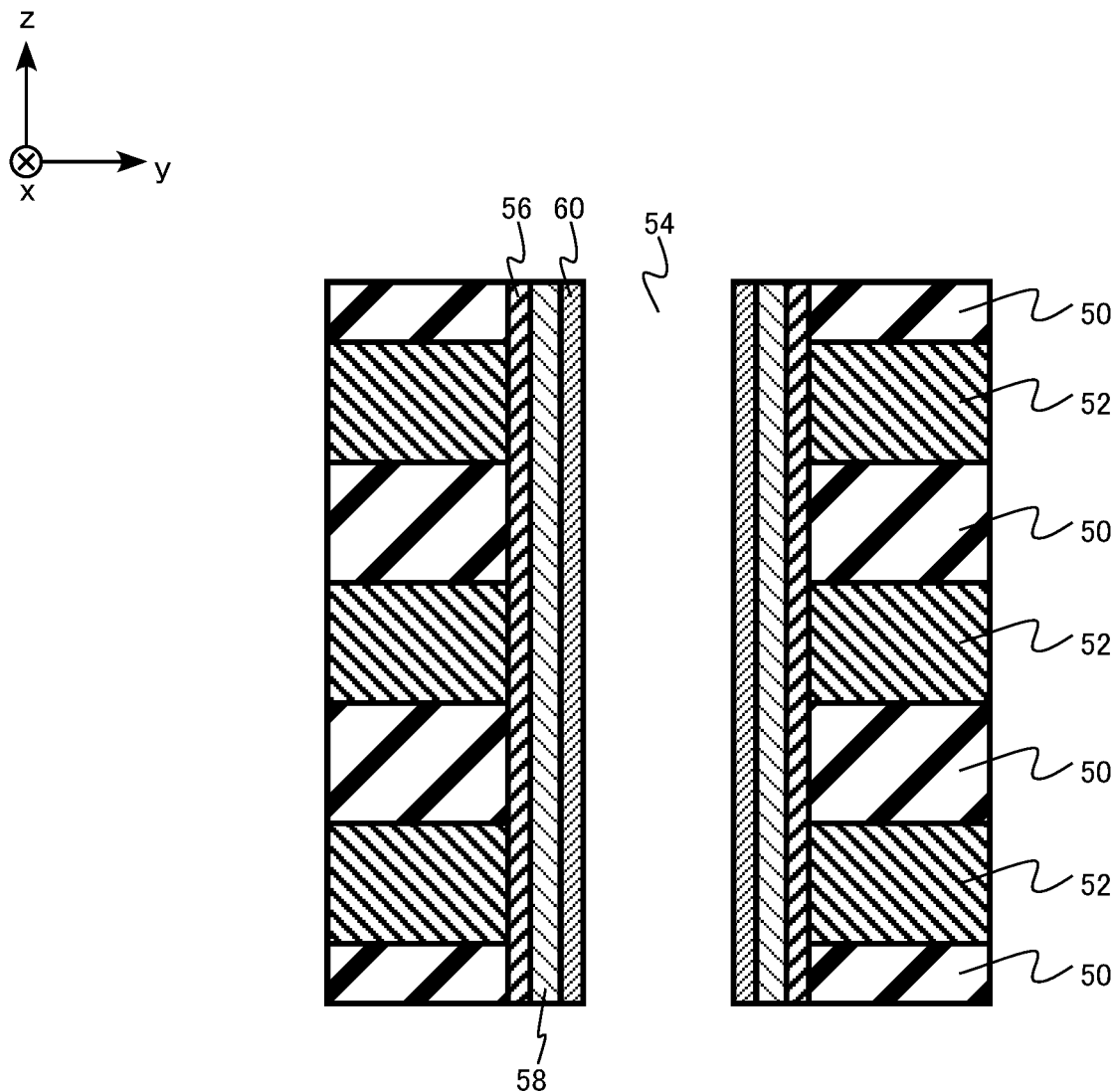
FIG. 8 is a schematic cross-sectional view illustrating an example of the method for manufacturing the semiconductor memory device of the first embodiment.

Next, a stacked insulating film 60 is formed on the second silicon nitride film 58 (FIG. 8). The stacked insulating film 60 is an example of the fourth insulating film. The stacked insulating film 60 is, for example, a stacked film of a silicon oxide film, a silicon nitride film, and a silicon oxide film.

The stacked insulating film 60 is formed by, for example, the CVD method. The stacked insulating film 60 ultimately becomes the tunnel insulating layer 12.

Figure 9:
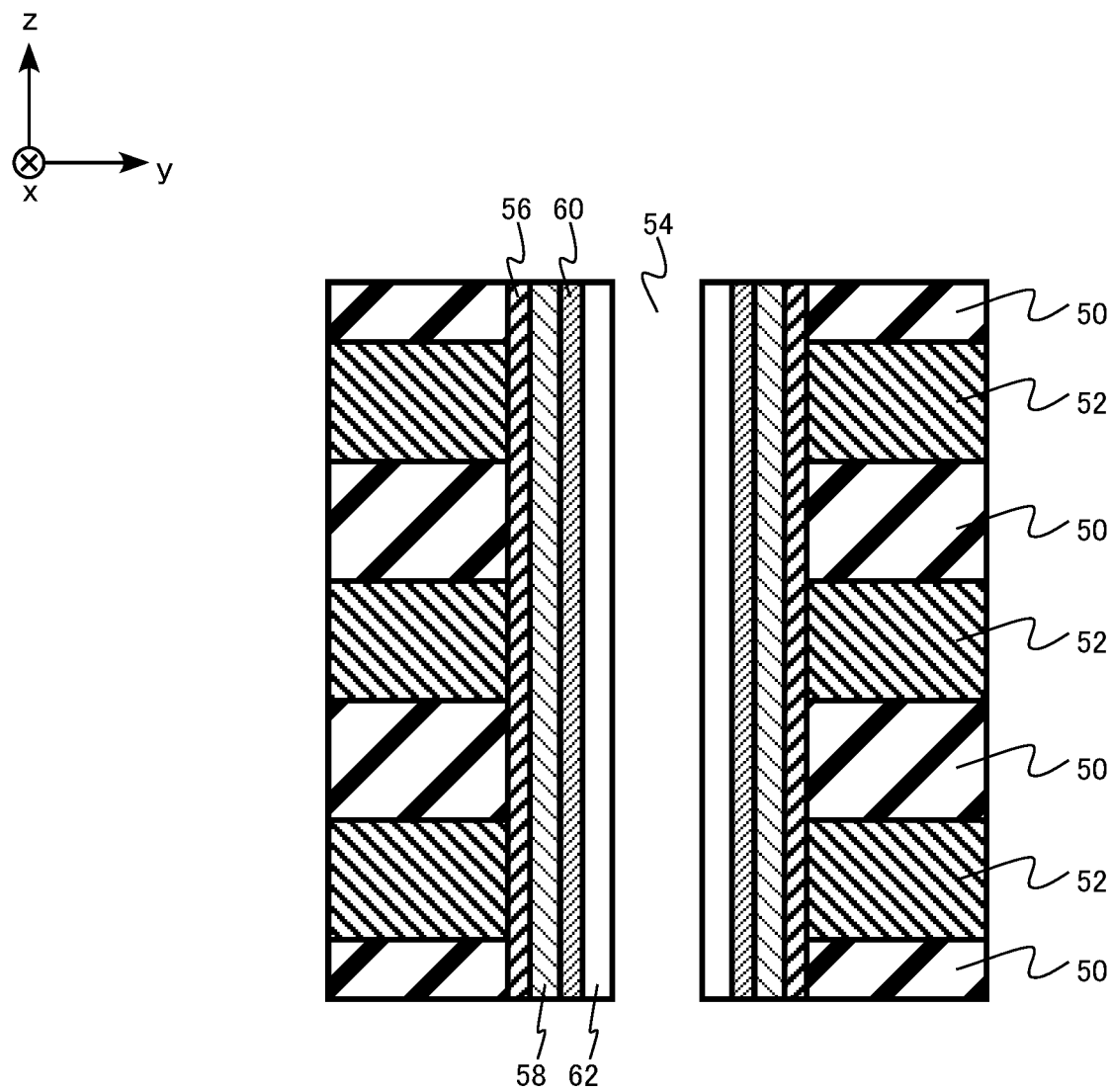
FIG. 9 is a schematic cross-sectional view illustrating an example of the method for manufacturing the semiconductor memory device of the first embodiment.

Next, a polycrystalline silicon film 62 is formed on the stacked insulating film 60 (FIG. 9). The polycrystalline silicon film 62 is an example of the semiconductor film. The polycrystalline silicon film 62 is formed by, for example, the CVD method. The polycrystalline silicon film 62 ultimately becomes the semiconductor layer 10.

Figure 10:
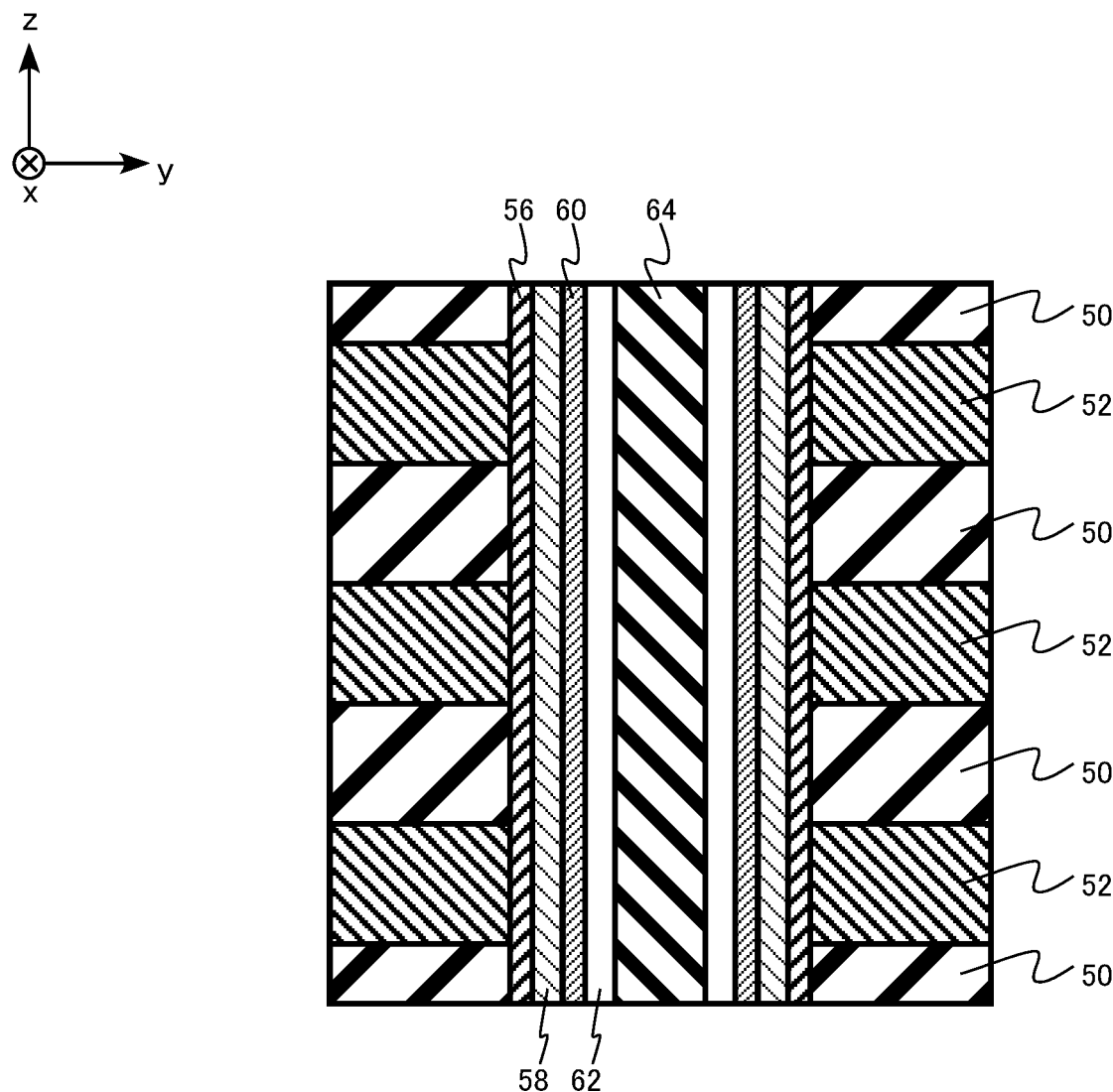
FIG. 10 is a schematic cross-sectional view illustrating an example of the method for manufacturing the semiconductor memory device of the first embodiment.

Next, the memory hole 54 is filled with a third silicon oxide film 64 (FIG. 10). The third silicon oxide film 64 is formed on the polycrystalline silicon film 62. The third silicon oxide film 64 is formed by, for example, the CVD method. The third silicon oxide film 64 ultimately becomes the core insulating region 20.

Figure 11:
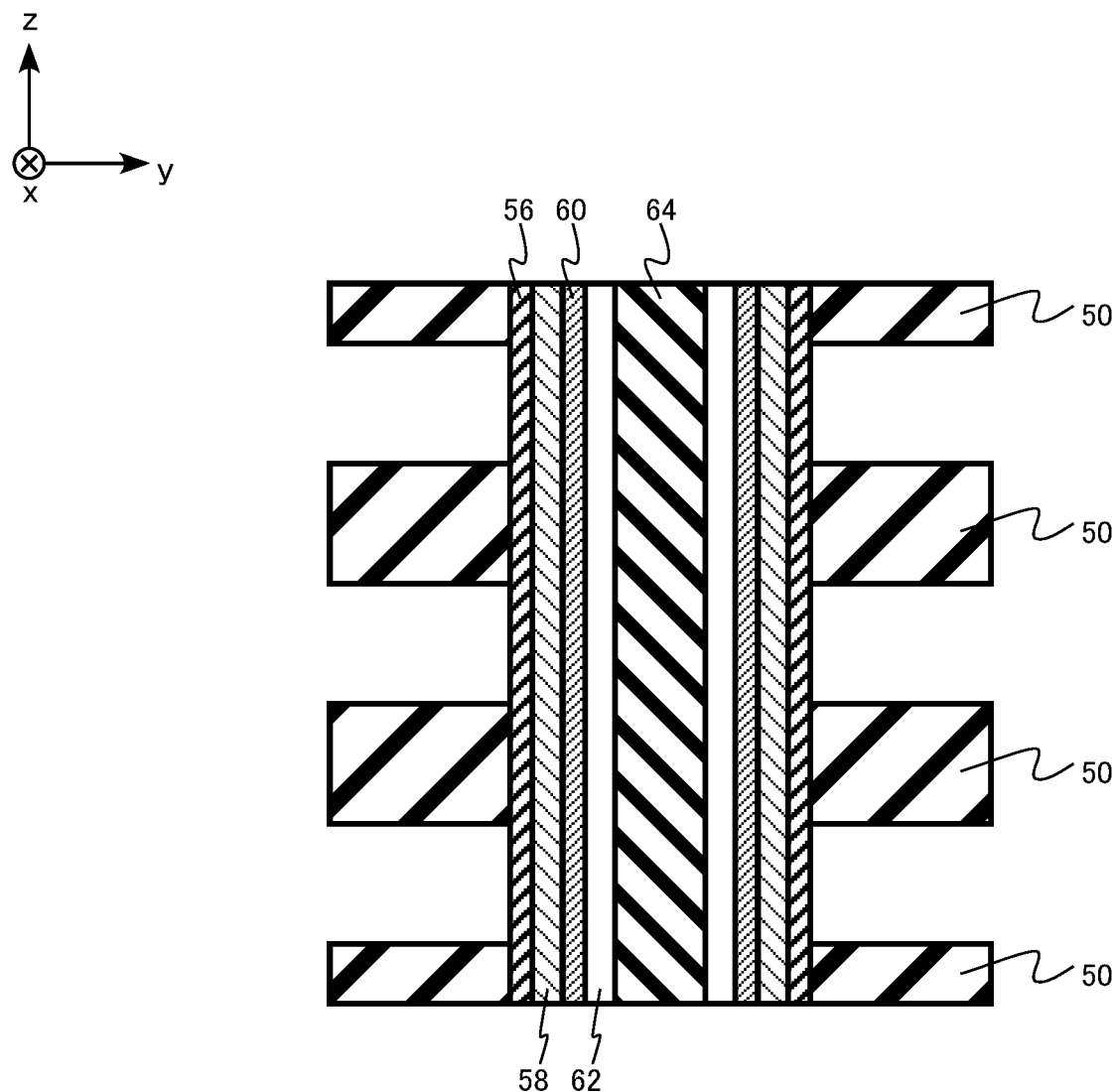
FIG. 11 is a schematic cross-sectional view illustrating an example of the method for manufacturing the semiconductor memory device of the first embodiment.

Next, the first silicon nitride film 52 is selectively removed by wet etching using an etching groove not illustrated (FIG. 11). For example, a phosphoric acid solution is used for the wet etching. The silicon nitride film 52 is selectively etched with respect to the first silicon oxide film 50 and the second silicon oxide film 56.

Figure 12:
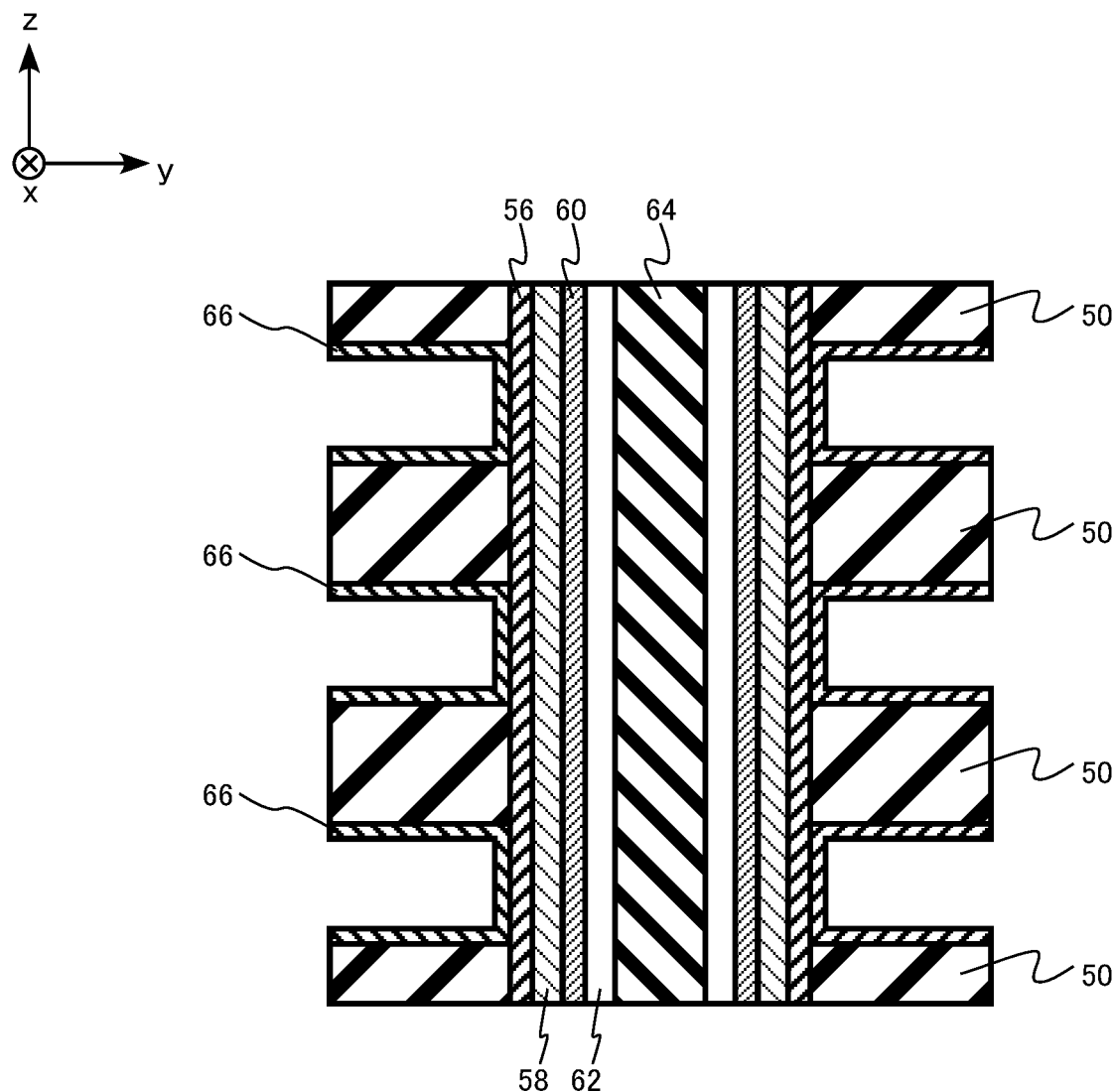
FIG. 12 is a schematic cross-sectional view illustrating an example of the method for manufacturing the semiconductor memory device of the first embodiment.

Next, an aluminum oxide film 66 is formed in the region from which the silicon nitride film 52 has been removed (FIG. 12). The aluminum oxide film 66 is an example of the fifth insulating film. The aluminum oxide film 66 is formed by, for example, the ALD method. The aluminum oxide film 66 ultimately becomes the second block insulating layer 15.

Next, crystallization annealing is performed. The crystallization annealing is performed, for example, at a temperature of 1000° C. in an inert gas atmosphere. The aluminum oxide film 66 becomes crystalline by the crystallization annealing.

Figure 13:
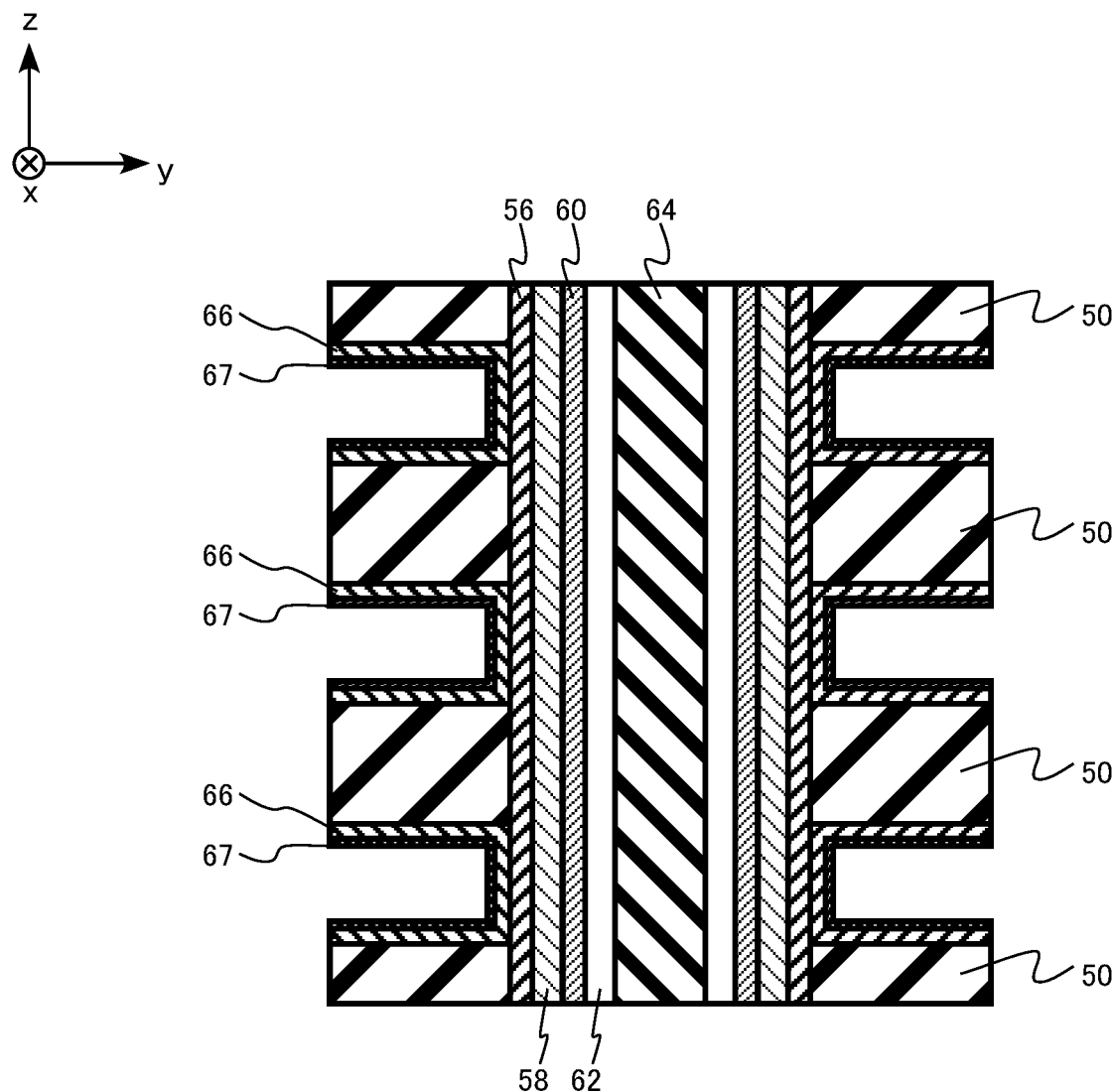
FIG. 13 is a schematic cross-sectional view illustrating an example of the method for manufacturing the semiconductor memory device of the first embodiment.

Next, a titanium nitride film 67 is formed on the aluminum oxide film 66 (FIG. 13). The titanium nitride film 67 is an example of a metal nitride film. The titanium nitride film 67 is formed by, for example, the ALD method.

Figure 14:
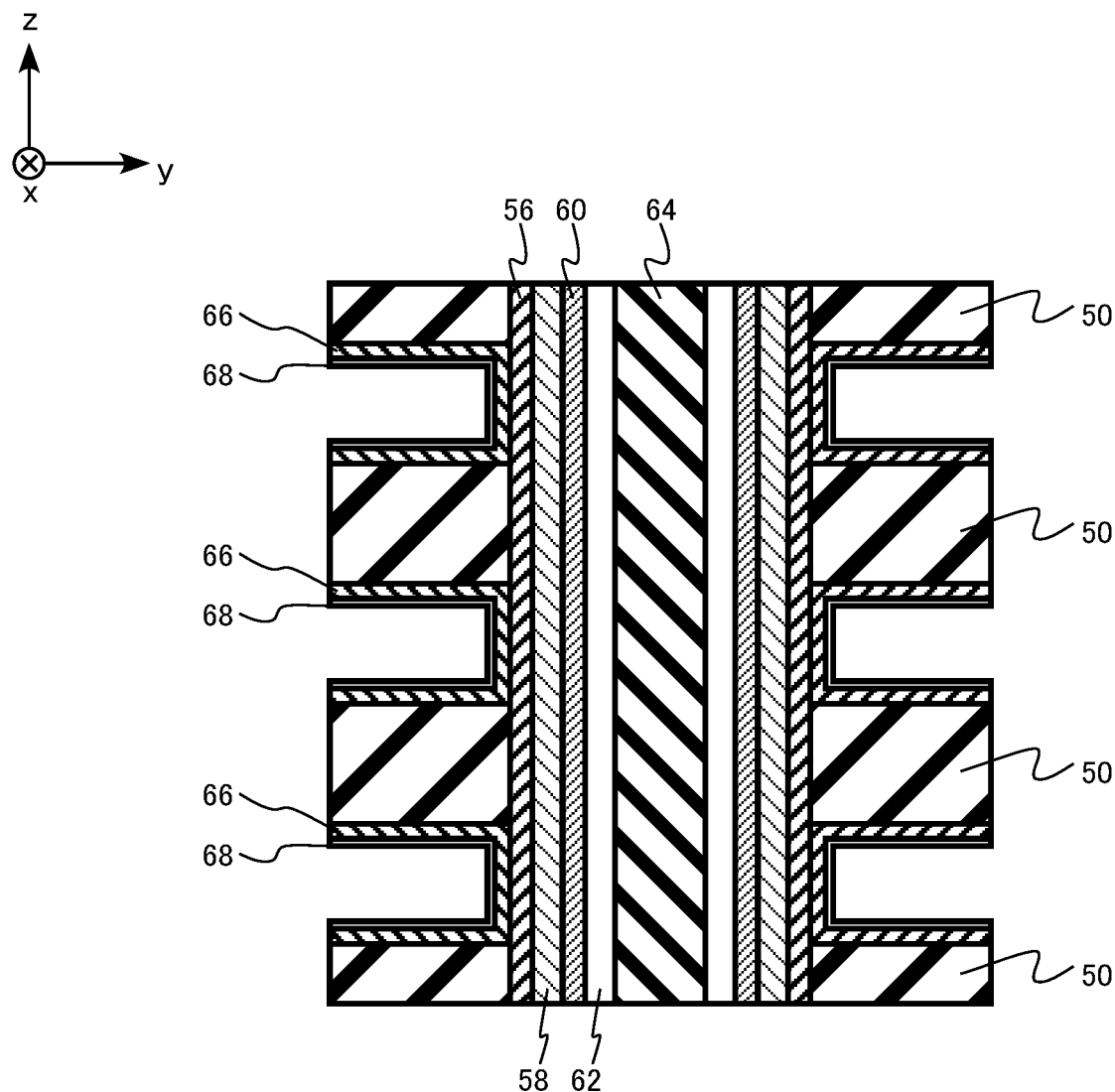
FIG. 14 is a schematic cross-sectional view illustrating an example of the method for manufacturing the semiconductor memory device of the first embodiment.

Next, a titanium oxide film 68 is formed by oxidizing the titanium nitride film 67 (FIG. 14). The titanium oxide film 68 is an example of the metal oxide film. The oxidation of the titanium nitride film 67 is, for example, thermal oxidation. The titanium oxide film 68 ultimately becomes the metal oxide layer 16.

Figure 15:
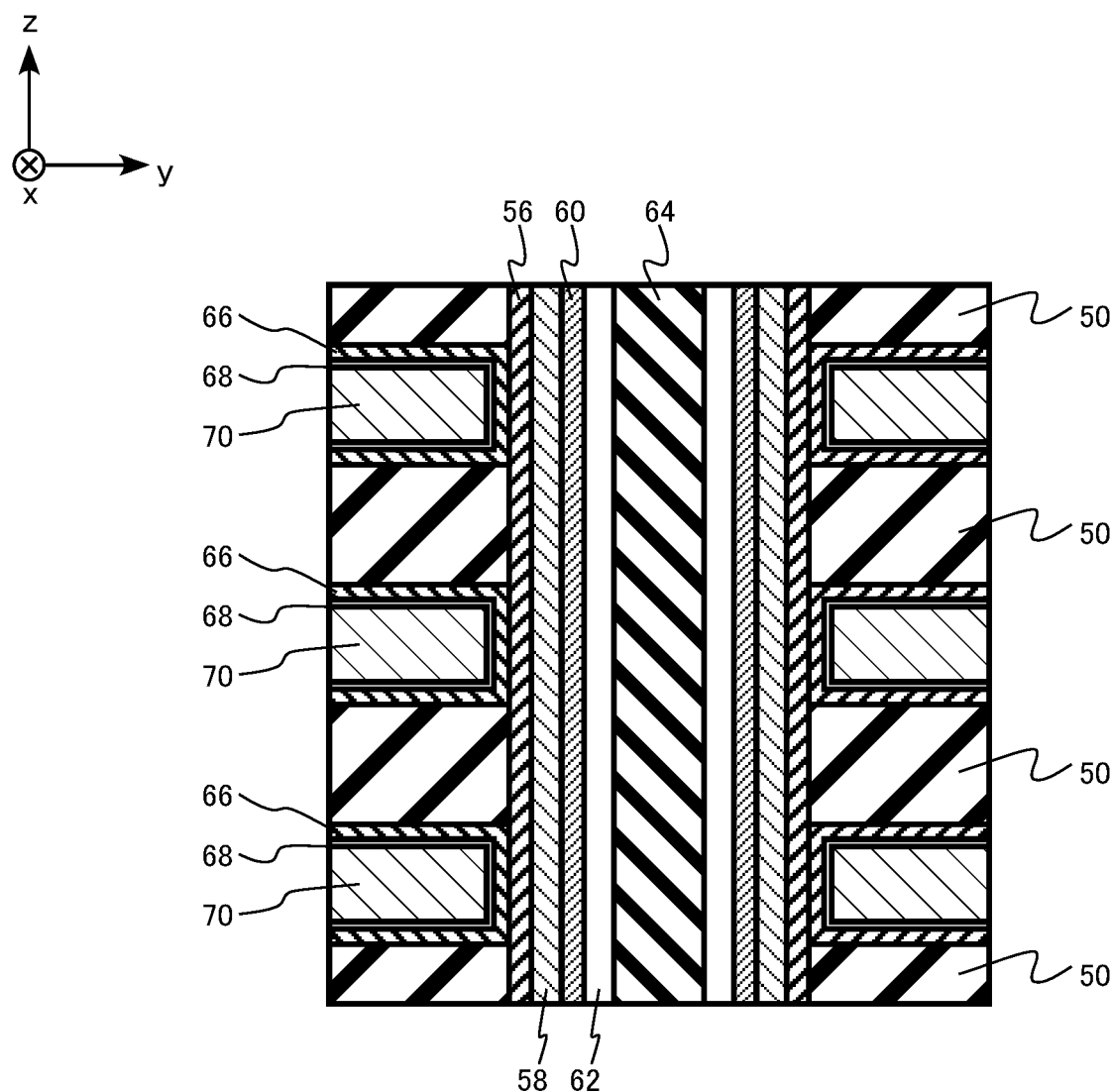
FIG. 15 is a schematic cross-sectional view illustrating an example of the method for manufacturing the semiconductor memory device of the first embodiment.

Next, a molybdenum film 70 is formed on the titanium oxide film 68 (FIG. 15). The molybdenum film 70 is an example of the metal film. The molybdenum film 70 is formed by, for example, the CVD method. The molybdenum film 70 ultimately becomes the word line WL.

The memory cell array 100 of the semiconductor memory device of the first embodiment is manufactured by the above method for manufacturing.

Note that the treatment for oxidizing the titanium nitride film 67 is not limited to thermal oxidation. For example, other oxidation treatment such as plasma oxidation can also be used.

The titanium oxide film 68 can be formed not by oxidation of the titanium nitride film 67 but by the CVD method, for example.

Next, functions and effects of the semiconductor memory device of the first embodiment will be described.

The semiconductor memory device of the first embodiment is provided with the metal oxide layer 16 between the second block insulating layer 15 and the word line WL. Since the metal oxide layer 16 is provided, diffusion of impurities from the word line WL side to the second block insulating layer 15 or the first block insulating layer 14 is suppressed.

Therefore, a leakage current between the charge storage layer 13 and the word line WL due to impurities is suppressed. This improves the charge retention characteristics of the semiconductor memory device.

(Variation)

Figure 16A:
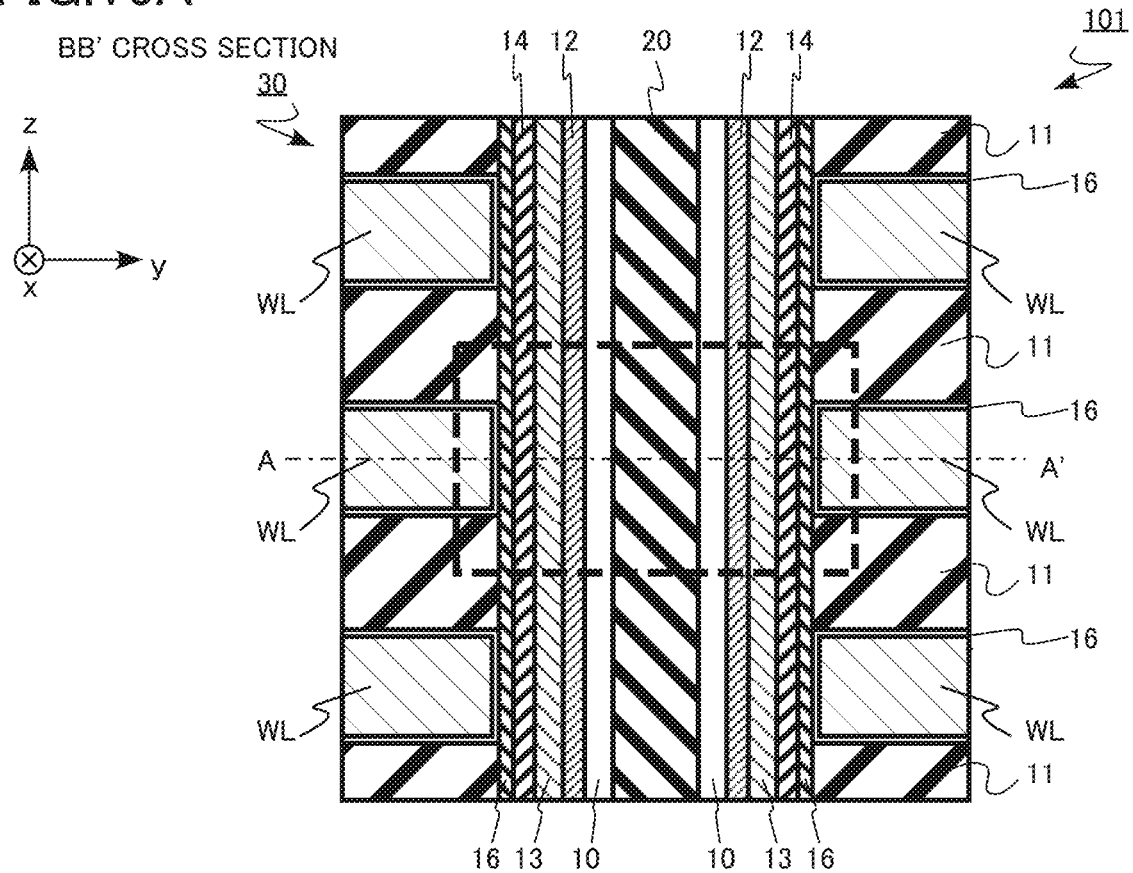
FIG. 16A is a schematic cross-sectional view of a memory cell array of a semiconductor memory device of a variation of the first embodiment.
Figure 16B:
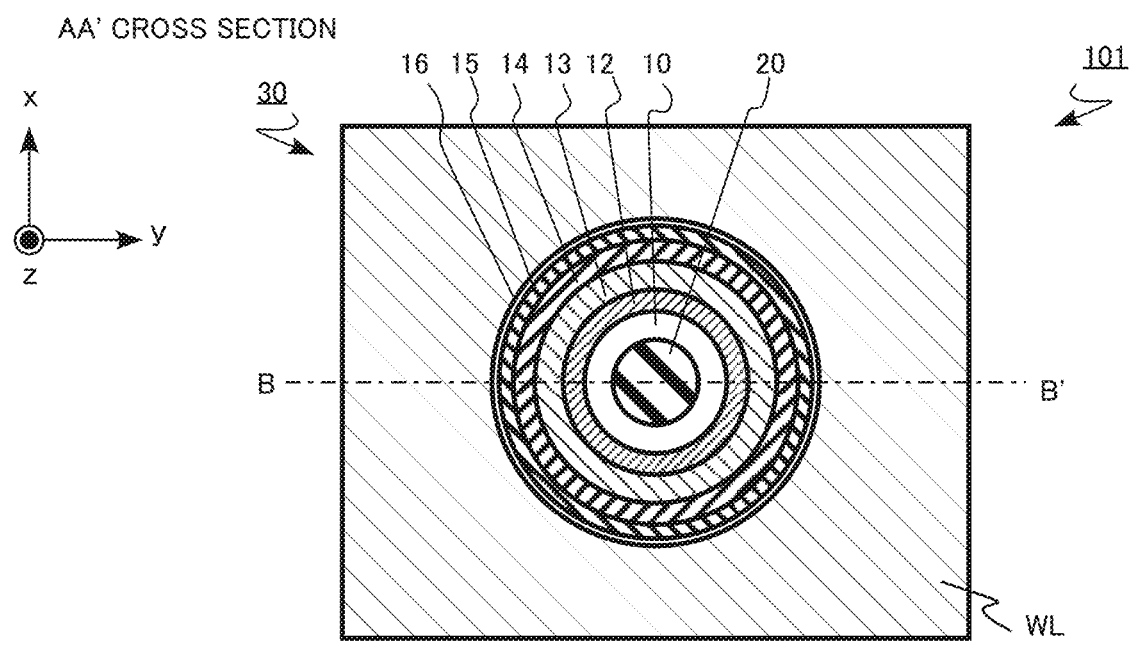
FIG. 16B is a schematic cross-sectional view of a memory cell array of a semiconductor memory device of a variation of the first embodiment.

FIGS. 16A and 16B are schematic cross-sectional views of the memory cell array of the semiconductor memory device of a variation of the first embodiment. FIGS. 16A and 16B are views corresponding to FIGS. 2A and 2B of the first embodiment.

FIG. 16A is a yz cross-sectional view of a memory cell array 101 of the variation. FIG. 16A is a BB' cross section of FIG. 16B. FIG. 16B is an xy cross-sectional view of the memory cell array 101 of the variation. FIG. 16B is an AA' cross section of FIG. 16A. In FIG. 16A, a region enclosed by a broken line is one memory cell.

Figure 17:
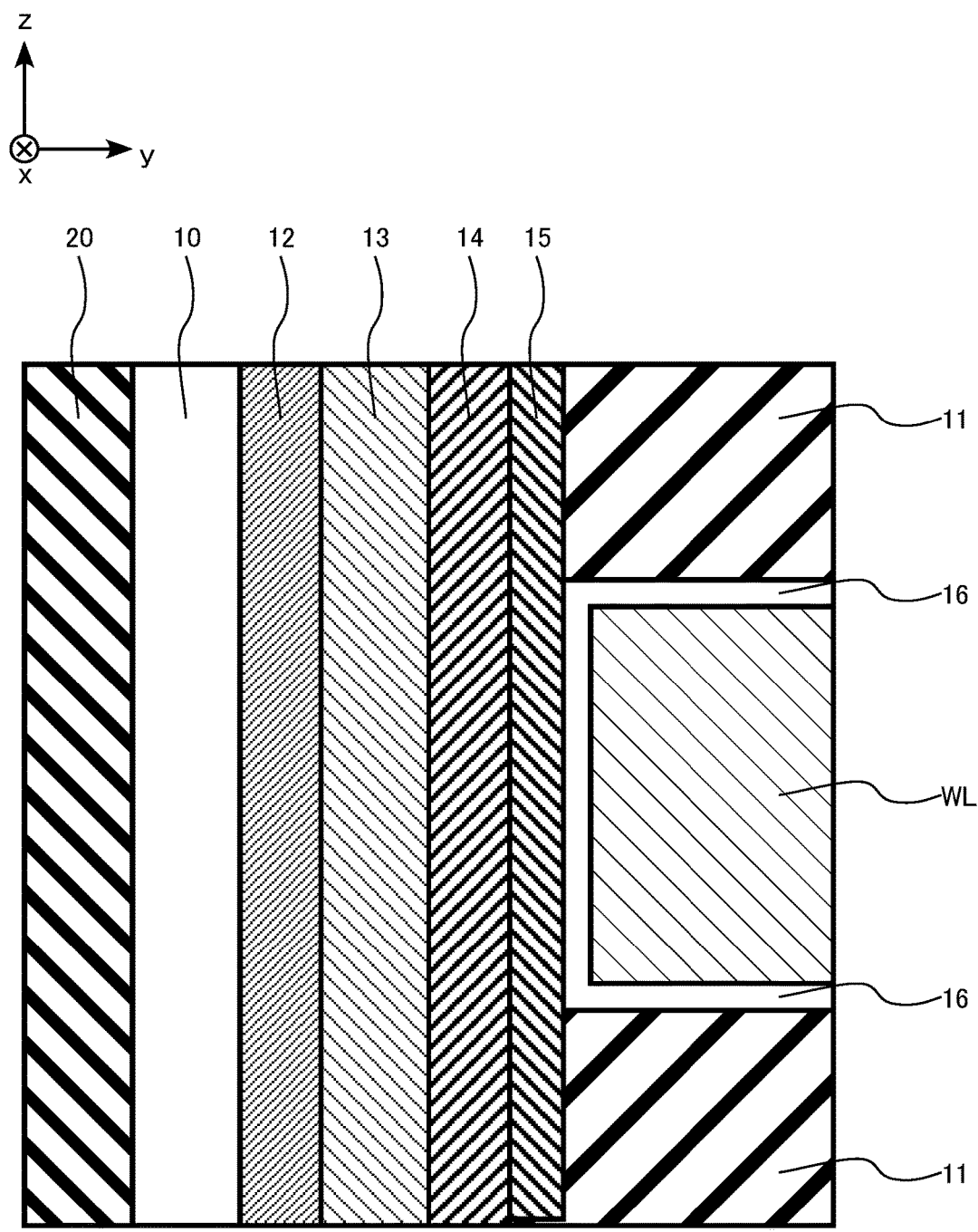
FIG. 17 is a schematic cross-sectional view of a memory cell of the semiconductor memory device of the variation of the first embodiment.

FIG. 17 is a schematic cross-sectional view of the memory cell of the semiconductor memory device of the variation of the first embodiment. FIG. 17 is an enlarged cross-sectional view of a part of the memory cell. FIG. 17 is a view corresponding to FIG. 3 of the first embodiment.

The semiconductor memory device of the variation is different from that of the first embodiment in that the second block insulating layer 15 extends in the z direction along the first block insulating layer 14. For example, a part of the second block insulating layer 15 is provided between the interlayer insulating layer 11 and the first block insulating layer 14 in the y direction.

The semiconductor memory device of the variation can be manufactured by, after forming the memory hole 54 and before forming the second silicon oxide film 56, forming an aluminum oxide film that ultimately becomes the first block insulating layer 14 in the method for manufacturing of the first embodiment, for example.

As described above, according to the first embodiment, it is possible to provide a semiconductor memory device capable of improving charge retention characteristics.

Second Embodiment

The semiconductor memory device of the second embodiment is different from the semiconductor memory device of the first embodiment in further including a metal nitride layer provided between the metal oxide layer and the third insulating layer and containing at least one second metal element selected from a group consisting of titanium (Ti), molybdenum (Mo), tungsten (W), and tantalum (Ta). Hereinafter, part of description of the content overlapping the first embodiment may be omitted.

Figure 18:
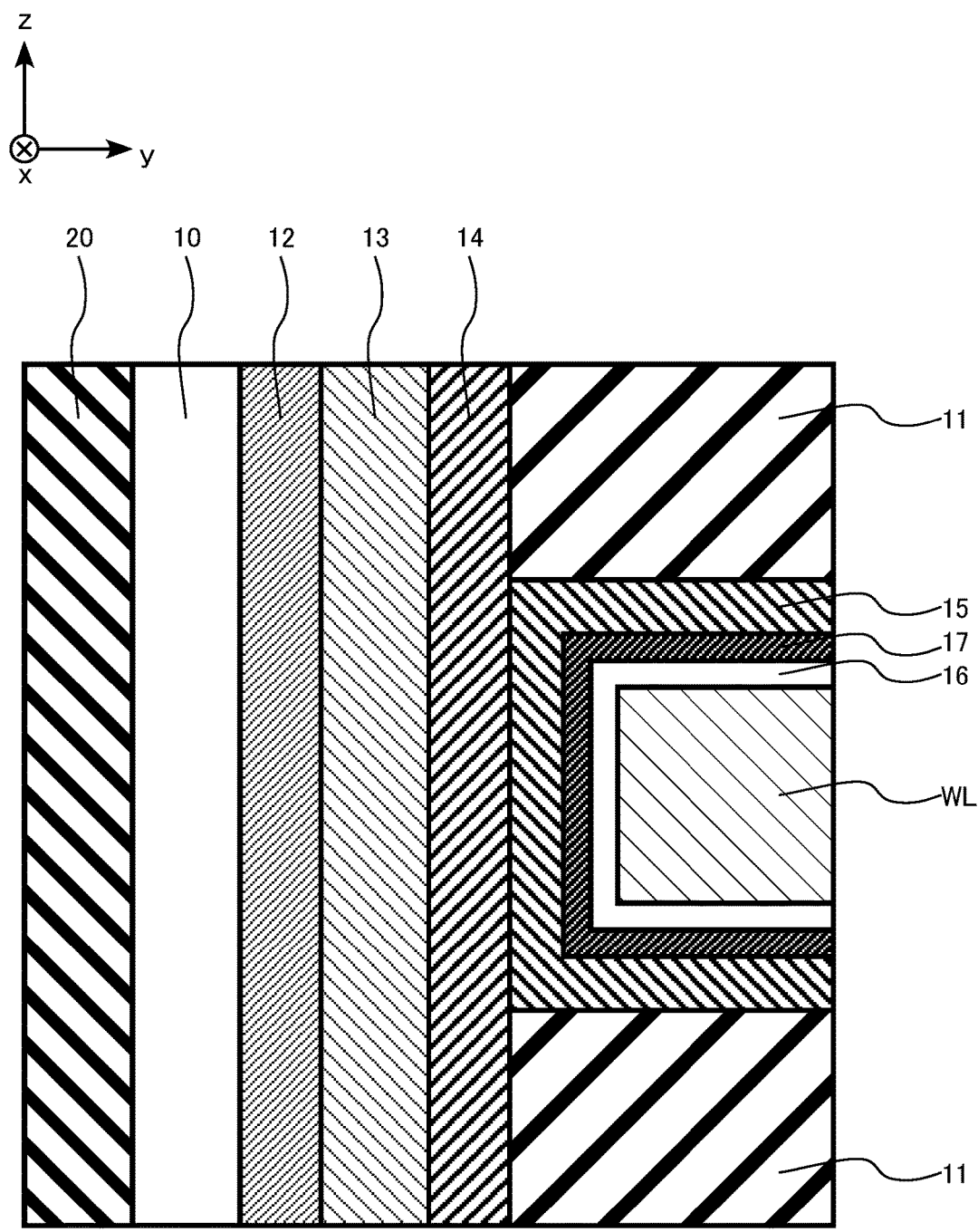
FIG. 18 is a schematic cross-sectional view of a memory cell of a semiconductor memory device of a second embodiment.

FIG. 18 is a schematic cross-sectional view of the memory cell of the semiconductor memory device of the second embodiment. FIG. 18 is an enlarged cross-sectional view of a part of the memory cell. FIG. 18 is a view corresponding to FIG. 3 of the first embodiment.

As illustrated in FIG. 18, the semiconductor memory device of the second embodiment includes a metal nitride layer 17. The metal nitride layer 17 is provided between the second block insulating layer 15 and the metal oxide layer 16.

The metal nitride layer 17 contains at least one second metal element selected from a group consisting of titanium (Ti), molybdenum (Mo), tungsten (W), and tantalum (Ta). The metal nitride layer 17 has, as a main component, at least one second metal element selected from a group consisting of, for example, titanium (Ti), molybdenum (Mo), tungsten (W), and tantalum (Ta).

The metal nitride layer 17 has, for example, titanium (Ti), molybdenum (Mo), tungsten (W), or tantalum (Ta) as a main component. For example, that the metal nitride layer 17 has titanium (Ti) as a main component means that an element having an atomic concentration higher than that of titanium (Ti) does not exist other than nitrogen (N) among the elements contained in the metal nitride layer 17.

The metal nitride layer 17 contains, for example, titanium nitride, molybdenum nitride, tungsten nitride, or tantalum nitride. The metal nitride layer 17 is, for example, a titanium nitride layer, a molybdenum nitride layer, a tungsten nitride layer, or a tantalum nitride layer.

The thickness of the metal nitride layer 17 in the y direction is thicker than the thickness of the metal oxide layer 16 in the y direction, for example. The thickness of the metal nitride layer 17 in the y direction is, for example, equal to or more than 1 nm and equal to or less than 5 nm.

The metal oxide layer 16 contains at least one first metal element selected from a group consisting of titanium (Ti), molybdenum (Mo), tungsten (W), and tantalum (Ta). The first metal element contained in the metal oxide layer 16 and the second metal element contained in the metal nitride layer 17 are the same element, for example.

The metal nitride layer 17 can be formed by allowing a part of the titanium nitride film 67 to remain without being oxidized when the titanium oxide film 68 is formed by oxidizing the titanium nitride film 67 in the method for manufacturing of the first embodiment, for example. The metal nitride layer 17 can be formed also by depositing a titanium nitride film by the CVD method before forming the titanium oxide film 68 in the method for manufacturing of the first embodiment, for example.

In the semiconductor memory device of the second embodiment, similarly to the first embodiment, the metal oxide layer 16 is provided between the second block insulating layer 15 and the word line WL. Therefore, diffusion of impurities from the word line WL side to the second block insulating layer 15 or the first block insulating layer 14 is suppressed, and the charge retention characteristics are improved.

Furthermore, the semiconductor memory device of the second embodiment includes a stacked structure of the metal nitride layer 17 and the metal oxide layer 16 between the second block insulating layer 15 and the word line WL, so that the erase saturation characteristics of the semiconductor memory device is improved. It is considered that the improvement of the erase saturation characteristics is caused by an increase in the work function on the word line WL side by providing the stacked structure of the metal nitride layer 17 and the metal oxide layer 16.

From the viewpoint of improving the erase saturation characteristics, the thickness of the metal nitride layer 17 in the y direction is preferably equal to or less than 3.5 nm.

From the viewpoint of forming the stacked structure of the metal nitride layer 17 and the metal oxide layer 16 by oxidation of the metal nitride film in the metal oxide layer 16, the first metal element contained in the metal oxide layer 16 and the second metal element contained in the metal nitride layer 17 are preferably the same element.

As described above, according to the second embodiment, it is possible to provide a semiconductor memory device capable of improving charge retention characteristics and improving erase saturation characteristics.

Third Embodiment

The semiconductor memory device of the third embodiment is different from the semiconductor memory device of the first embodiment in further including a metal nitride layer provided between the metal oxide layer and the gate electrode layer and containing at least one second metal element selected from a group consisting of titanium (Ti), molybdenum (Mo), tungsten (W), and tantalum (Ta). Hereinafter, part of description of the content overlapping the first embodiment may be omitted.

Figure 19:
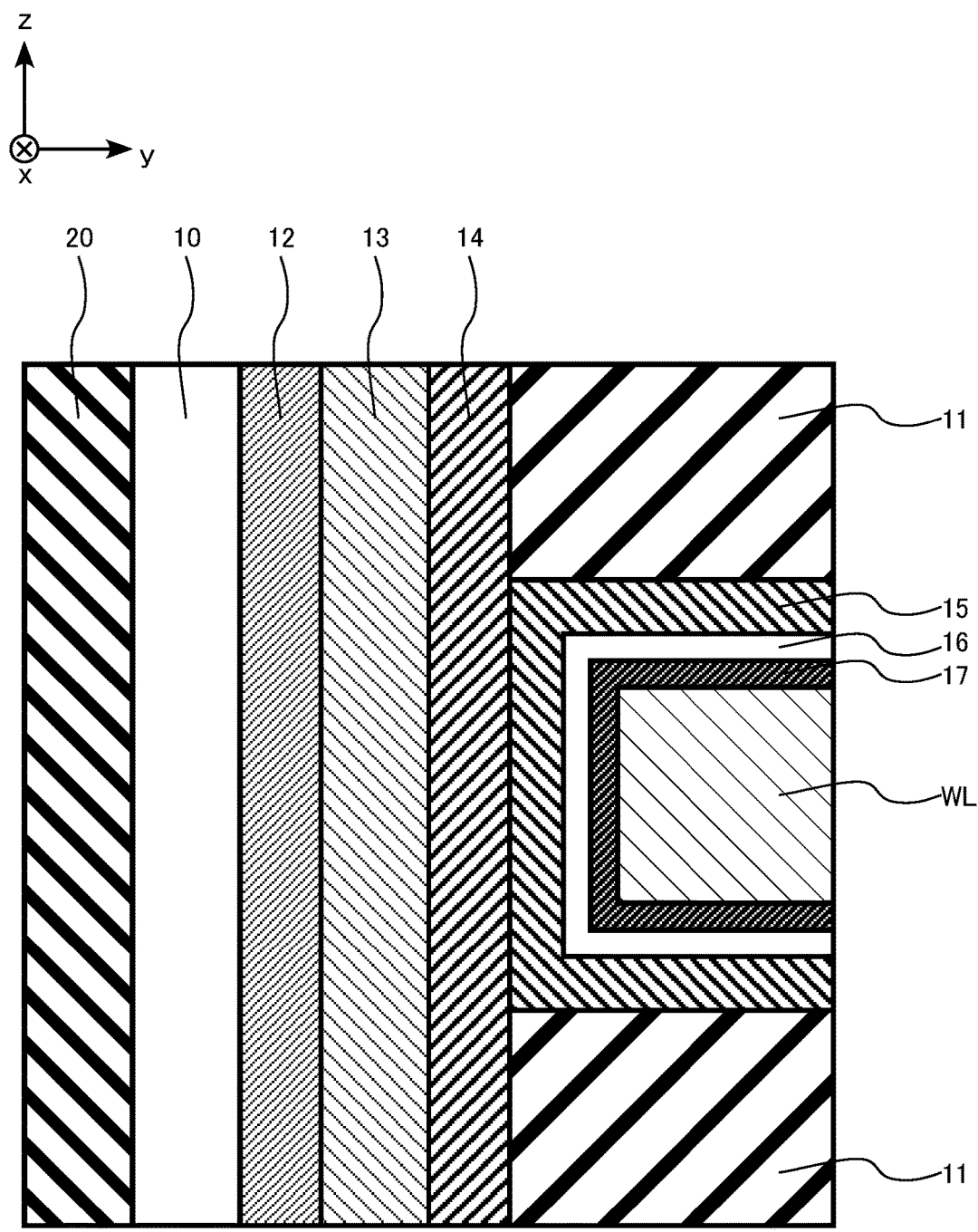
FIG. 19 is a schematic cross-sectional view of a memory cell of a semiconductor memory device of a third embodiment.

FIG. 19 is a schematic cross-sectional view of the memory cell of the semiconductor memory device of the third embodiment. FIG. 19 is an enlarged cross-sectional view of a part of the memory cell. FIG. 19 is a view corresponding to FIG. 3 of the first embodiment.

As illustrated in FIG. 19, the semiconductor memory device of the third embodiment includes the metal nitride layer 17. The metal nitride layer 17 is provided between the metal oxide layer 16 and the word line WL.

The metal nitride layer 17 contains at least one second metal element selected from a group consisting of titanium (Ti), molybdenum (Mo), tungsten (W), and tantalum (Ta). The metal nitride layer 17 has, as a main component, at least one second metal element selected from a group consisting of, for example, titanium (Ti), molybdenum (Mo), tungsten (W), and tantalum (Ta).

The metal nitride layer 17 has, for example, titanium (Ti), molybdenum (Mo), tungsten (W), or tantalum (Ta) as a main component. For example, that the metal nitride layer 17 has titanium (Ti) as a main component means that an element having an atomic concentration higher than that of titanium (Ti) does not exist other than nitrogen (N) among the elements contained in the metal nitride layer 17.

The metal nitride layer 17 contains, for example, titanium nitride, molybdenum nitride, tungsten nitride, or tantalum nitride. The metal nitride layer 17 is, for example, a titanium nitride layer, a molybdenum nitride layer, a tungsten nitride layer, or a tantalum nitride layer.

The metal oxide layer 16 contains at least one first metal element selected from a group consisting of titanium (Ti), molybdenum (Mo), tungsten (W), and tantalum (Ta). The first metal element contained in the metal oxide layer 16 and the second metal element contained in the metal nitride layer 17 are the same element, for example.

The metal nitride layer 17 can be formed by forming the titanium oxide film 68 and then depositing a titanium nitride film by the CVD method in the method for manufacturing of the first embodiment, for example.

In the semiconductor memory device of the third embodiment, similarly to the first embodiment, the metal oxide layer 16 is provided between the second block insulating layer 15 and the word line WL. Therefore, diffusion of impurities from the word line WL side to the second block insulating layer 15 or the first block insulating layer 14 is suppressed, and the charge retention characteristics are improved.

As described above, according to the third embodiment, it is possible to provide a semiconductor memory device capable of improving charge retention characteristics.

Fourth Embodiment

A semiconductor memory device of the fourth embodiment includes: a semiconductor layer extending in a first direction; a gate electrode layer containing molybdenum (Mo); a first insulating layer provided between the semiconductor layer and the gate electrode layer; a charge storage layer provided between the first insulating layer and the gate electrode layer; a second insulating layer provided between the charge storage layer and the gate electrode layer and containing a first element and oxygen (O); and a third insulating layer provided between the second insulating layer and the gate electrode layer and containing a second element different from the first element, oxygen (O), and nitrogen (N).

The semiconductor memory device of the fourth embodiment is a three-dimensional NAND flash memory. The memory cell of the semiconductor memory device of the fourth embodiment is a memory cell of so-called metal-oxide-nitride-oxide-semiconductor type (MONOS type).

Figure 20:
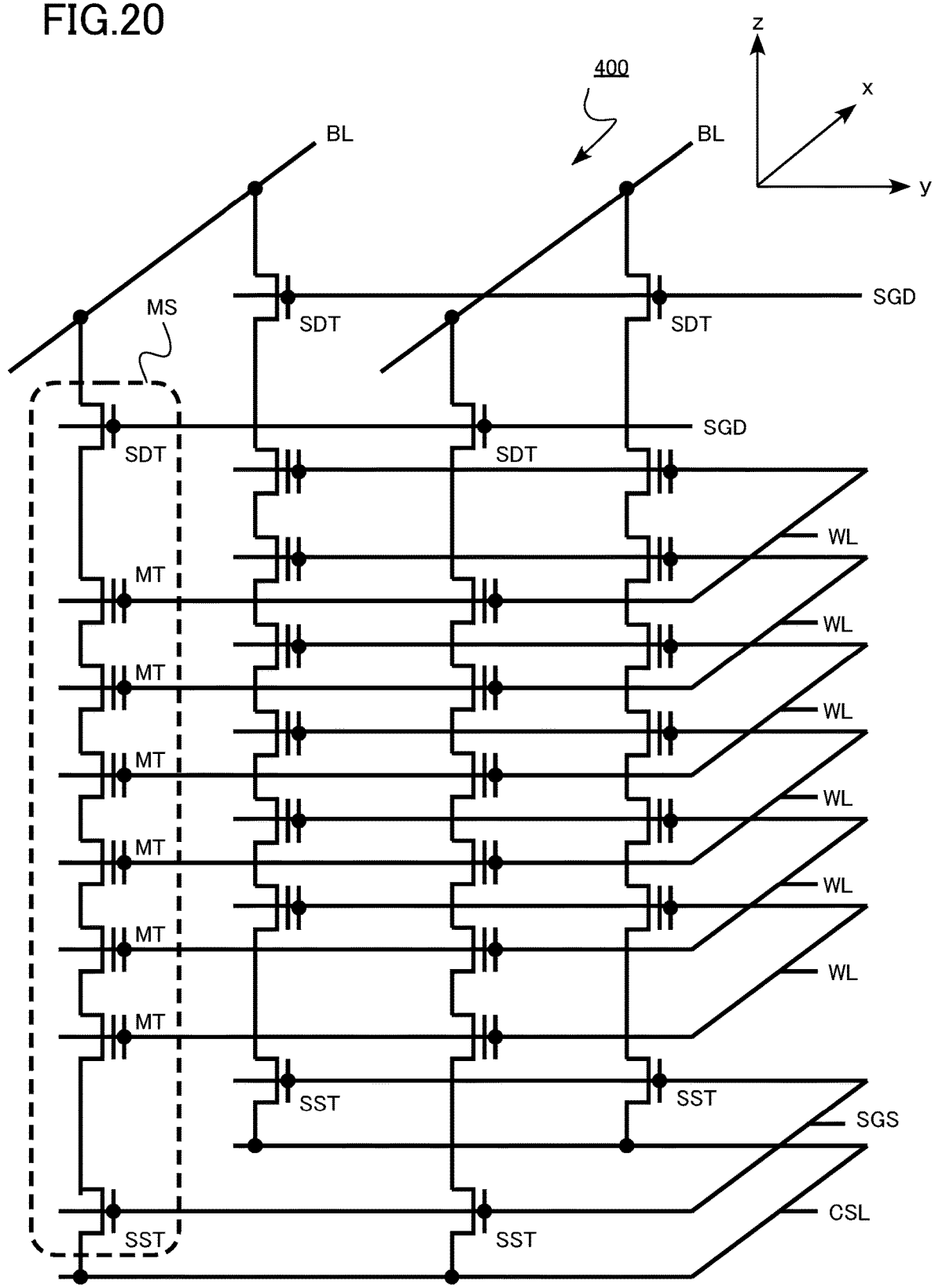
FIG. 20 is a circuit diagram of a memory cell array of a semiconductor memory device of a fourth embodiment.

FIG. 20 is a circuit diagram of the memory cell array of the semiconductor memory device of the fourth embodiment.

As illustrated in FIG. 20, a memory cell array 400 of the three-dimensional NAND flash memory of the fourth embodiment includes the plurality of word lines WL, the common source line CSL, the source selection gate line SGS, the plurality of drain selection gate lines SGD, the plurality of bit lines BL, and the plurality of memory strings MS.

The plurality of word lines WL are disposed in the z direction while being separated from one another. The plurality of word lines WL are stacked and disposed in the z direction. The plurality of memory strings MS extend in the z direction. The plurality of bit lines BL extend in the x direction, for example.

Hereinafter, the x direction is defined as a third direction, the y direction is defined as a second direction, and the z direction is defined as a first direction. The x direction, the y direction, and the z direction intersect one another, and are perpendicular to one another, for example.

As illustrated in FIG. 20, the memory string MS includes a source selection transistor SST, a plurality of memory cells, and a drain selection transistor SDT, which are connected in series between the common source line CSL and the bit line BL. One memory string MS is selected by selecting one bit line BL and one drain selection gate line SGD, and one memory cell can be selected by selecting one word line WL. The word line WL is a gate electrode of a memory cell transistor MT constituting the memory cell.

Figure 21A:
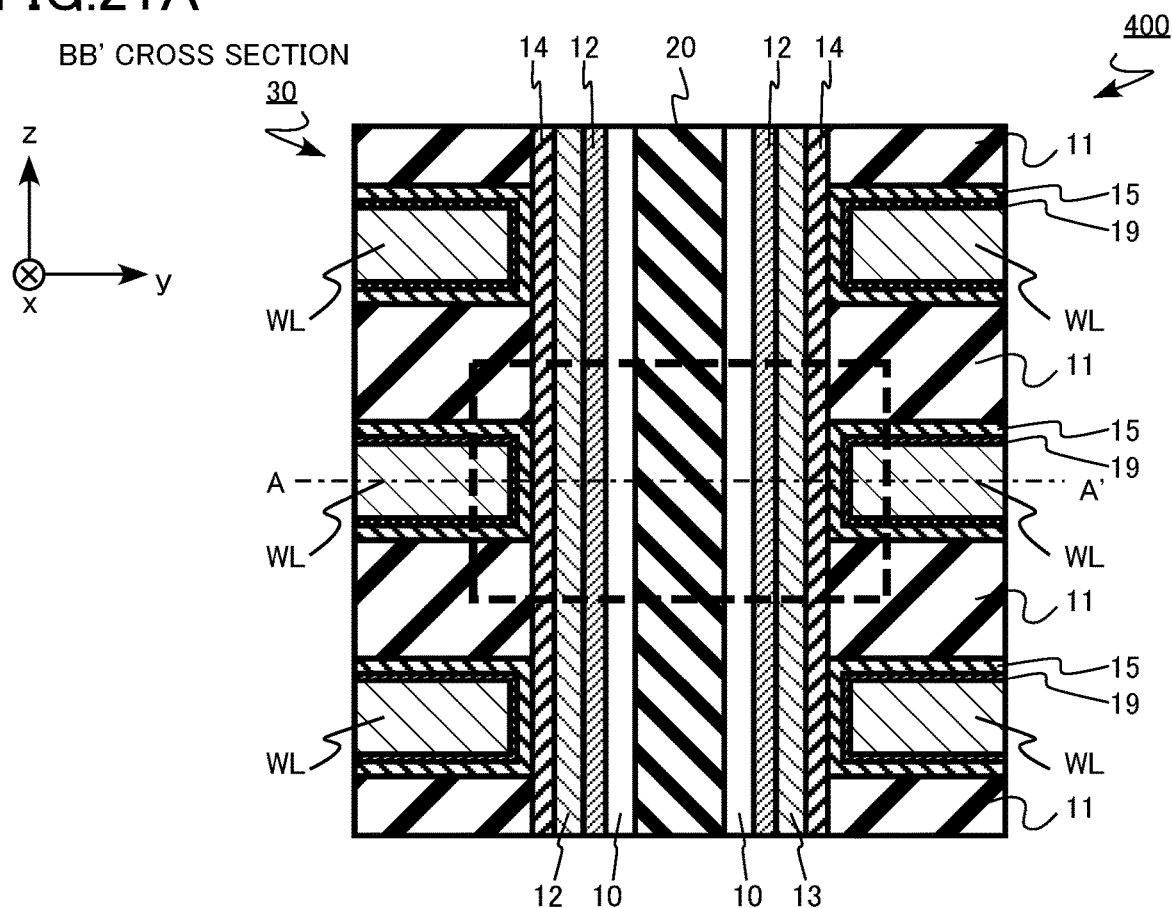
FIG. 21A is a schematic cross-sectional view of the memory cell array of the semiconductor memory device of the fourth embodiment.
Figure 21B:
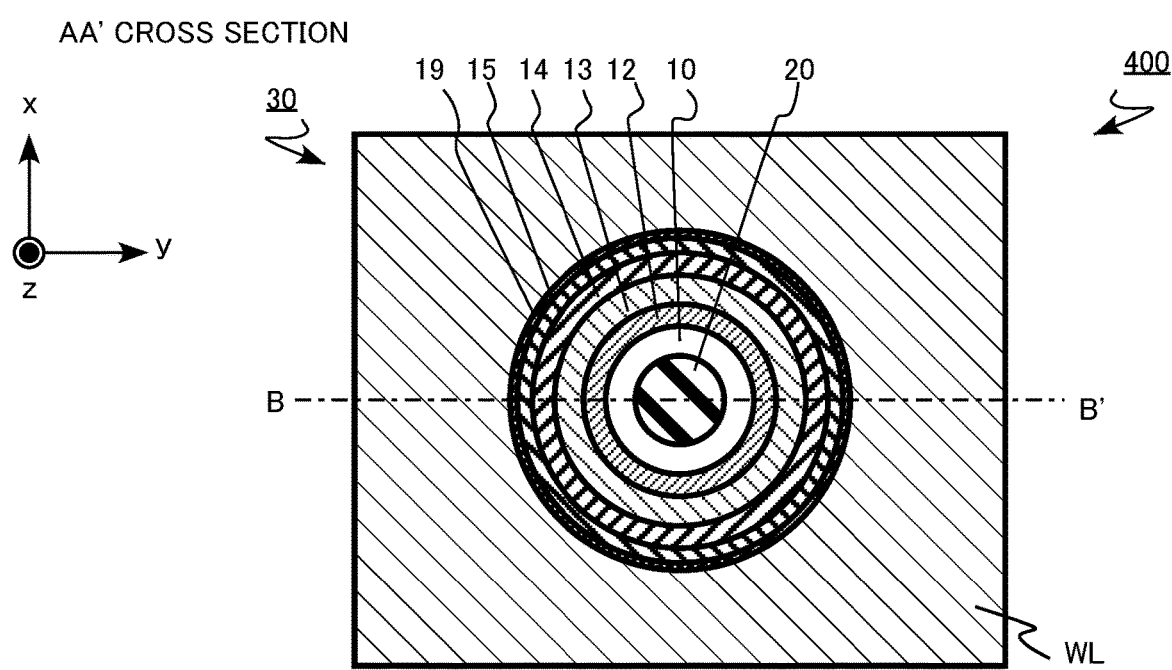
FIG. 21B is a schematic cross-sectional view of the memory cell array of the semiconductor memory device of the fourth embodiment.

FIGS. 21A and 21B are schematic cross-sectional views of the memory cell array of the semiconductor memory device of the fourth embodiment. FIGS. 21A and 21B illustrate a cross section of a plurality of memory cells in one memory string MS enclosed by a dotted line, for example, in the memory cell array 400 of FIG. 20.

FIG. 21A is a yz cross-sectional view of the memory cell array 400. FIG. 21A is a BB' cross section of FIG. 21B. FIG. 21B is an xy cross-sectional view of the memory cell array 400. FIG. 21B is an AA' cross section of FIG. 21A. In FIG. 21A, a region enclosed by a broken line is one memory cell.

Figure 22:
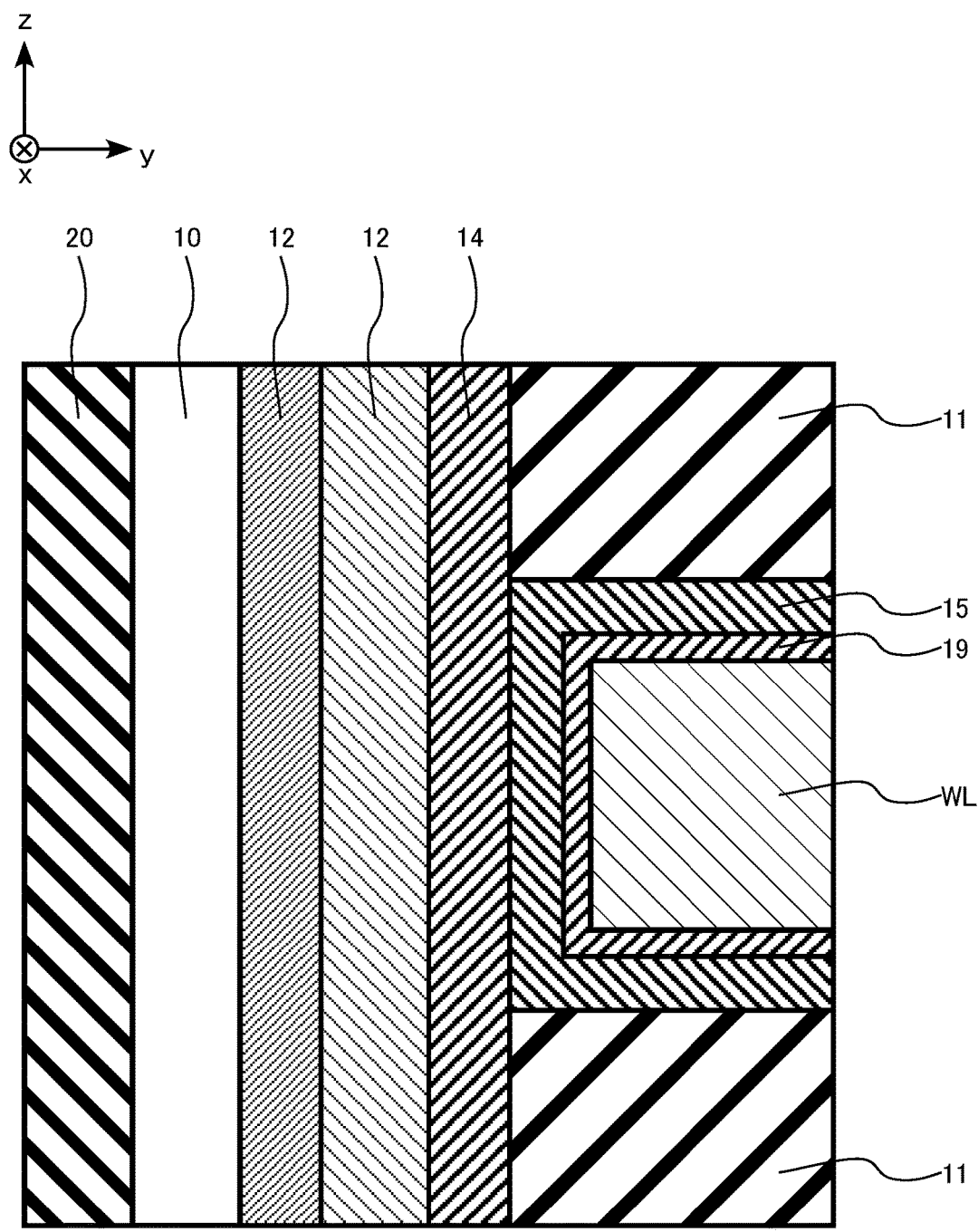
FIG. 22 is a schematic cross-sectional view of a memory cell of a semiconductor memory device of the fourth embodiment.

FIG. 22 is a schematic cross-sectional view of the memory cell of the semiconductor memory device of the fourth embodiment. FIG. 22 is an enlarged cross-sectional view of a part of the memory cell.

As illustrated in FIGS. 21A, 21B, and 22, the memory cell array 400 includes the word line WL, the semiconductor layer 10, the interlayer insulating layer 11, the tunnel insulating layer 12, the charge storage layer 13, the first block insulating layer 14, the second block insulating layer 15, a barrier metal layer 19, and the core insulating region 20.

The plurality of word lines WL and the plurality of interlayer insulating layers 11 constitute a stacked body 30.

The word line WL is an example of the gate electrode layer. The tunnel insulating layer 12 is an example of the first insulating layer. The first block insulating layer 14 is an example of the second insulating layer. The second block insulating layer 15 is an example of the third insulating layer.

The memory cell array 400 is provided on a semiconductor substrate not illustrated, for example. The semiconductor substrate has a surface parallel to the x direction and the y direction.

The word lines WL and the interlayer insulating layers 11 are alternately stacked in the z direction on the semiconductor substrate. The word lines WL are repeatedly disposed apart from one another in the z direction. The plurality of word lines WL and the plurality of interlayer insulating layers 11 constitute a stacked body 30. The word line WL functions as a control electrode of the memory cell transistor MT.

The word line WL is a plate-like conductor. The word line WL contains molybdenum (Mo). The word line WL has molybdenum (Mo) as a main component. That the word line WL has molybdenum (Mo) as a main component means that an element having an atomic concentration higher than that of molybdenum (Mo) does not exist among the elements contained in the word line WL.

The word line WL is, for example, a molybdenum layer. The thickness of the word line WL in the z direction is, for example, equal to or more than 5 nm and equal to or less than 20 nm.

The interlayer insulating layer 11 separates the word line WL from the word line WL. The interlayer insulating layer 11 electrically separates the word line WL from the word line WL.

The interlayer insulating layer 11 is, for example, an oxide, an oxynitride, or a nitride. The interlayer insulating layer 11 is, for example, silicon oxide. The thickness of the interlayer insulating layer 11 in the z direction is, for example, equal to or more than 5 nm and equal to or less than 20 nm.

The semiconductor layer 10 is provided in the stacked body 30. The semiconductor layer 10 extends in the z direction. The semiconductor layer 10 extends in a direction perpendicular to the surface of the semiconductor substrate.

The semiconductor layer 10 is provided to penetrate the stacked body 30. The semiconductor layer 10 is surrounded by the plurality of word lines WL. The semiconductor layer 10 has a cylindrical shape, for example. The semiconductor layer 10 functions as a channel of the memory cell transistor MT.

The semiconductor layer 10 is, for example, a polycrystalline semiconductor. The semiconductor layer 10 is, for example, polycrystalline silicon.

The tunnel insulating layer 12 is provided between the semiconductor layer 10 and the word line WL. The tunnel insulating layer 12 is provided between the semiconductor layer 10 and at least one of the plurality of word lines WL. The tunnel insulating layer 12 is provided between the semiconductor layer 10 and the charge storage layer 13. The tunnel insulating layer 12 has a function of passing charges according to a voltage applied between the word line WL and the semiconductor layer 10.

The tunnel insulating layer 12 contains, for example, silicon (Si), nitrogen (N), and oxygen (O). The tunnel insulating layer 12 contains, for example, silicon oxide, silicon nitride, or silicon oxynitride. The tunnel insulating layer 12 has a stacked structure of, for example, a silicon oxide layer, a silicon nitride layer, and a silicon oxide layer. The thickness of the tunnel insulating layer 12 is, for example, equal to or more than 3 nm and equal to or less than 8 nm.

The charge storage layer 13 is provided between the tunnel insulating layer 12 and the word line WL. The charge storage layer 13 is provided between the tunnel insulating layer 12 and the first block insulating layer 14. The charge storage layer 13 is provided between the tunnel insulating layer 12 and the second block insulating layer 15.

The charge storage layer 13 has a function of trapping and storing charges. The charge is, for example, an electron. The threshold voltage of the memory cell transistor MT changes according to the amount of charges stored in the charge storage layer 13. Use of this threshold voltage change enables one memory cell to store data.

For example, when the threshold voltage of the memory cell transistor MT changes, the voltage at which the memory cell transistor MT is turned on changes. For example, when a state in which the threshold voltage is high is defined as data "0" and a state in which the threshold voltage is low is defined as data "1", the memory cell can store 1-bit data of "0" and "1".

The charge storage layer 13 is an insulating layer. The charge storage layer 13 contains, for example, silicon (Si) and nitrogen (N). The charge storage layer 13 contains, for example, silicon nitride. The charge storage layer 13 is, for example, a silicon nitride layer. The thickness of the charge storage layer 13 is, for example, equal to or more than 3 nm and equal to or less than 10 nm.

The first block insulating layer 14 is provided between the charge storage layer 13 and the word line WL. The first block insulating layer 14 is provided between the charge storage layer 13 and the second block insulating layer 15.

The first block insulating layer 14 has a function of blocking a current flowing between the charge storage layer 13 and the word line WL.

The first block insulating layer 14 contains a first element and oxygen (O) The first block insulating layer 14 has the first element and oxygen (O) as main components. That the first block insulating layer 14 has the first element and oxygen (O) as main components means that an element having an atomic concentration higher than that of the first element or oxygen (O) does not exist other than the first element and oxygen (O) among the elements contained in the first block insulating layer 14.

The first element is, for example, silicon (Si) or aluminum (Al). The first block insulating layer 14 contains, for example, silicon oxide or aluminum oxide. The first block insulating layer 14 is, for example, a silicon oxide layer or an aluminum oxide layer.

The first block insulating layer 14 contains, for example, nitrogen (N). The first block insulating layer 14 includes, for example, silicon oxynitride or aluminum oxynitride. The first block insulating layer 14 is, for example, a silicon oxynitride layer or an aluminum oxynitride layer.

The thickness of the first block insulating layer 14 in the y direction is, for example, equal to or more than 1 nm and equal to or less than 8 nm.

The second block insulating layer 15 is provided between the first block insulating layer 14 and the word line WL in the y direction. The second block insulating layer 15 is provided between the word line WL and the interlayer insulating layer 11 in the z direction. The second block insulating layer 15 has a function of blocking a current flowing between the charge storage layer 13 and the word line WL.

The second block insulating layer 15 contains, for example, the second element different from the first element, oxygen (O), and nitrogen (N). The second block insulating layer 15 has, for example, the second element, oxygen (O), and nitrogen (N) as main components. That the second block insulating layer 15 has the second element, oxygen (O), and nitrogen (N) as main components means that an element having an atomic concentration higher than that of the second element, oxygen (O), or nitrogen (N) does not exist other than the second element, oxygen (O), and nitrogen (N) among the elements contained in the second block insulating layer 15. The second element is, for example, aluminum (Al), hafnium (Hf), or zirconium (Zr).

The second block insulating layer 15 contains, for example, aluminum oxynitride, hafnium oxynitride, or zirconium oxynitride. The second block insulating layer 15 is, for example, an aluminum oxynitride layer, a hafnium oxynitride layer, or a zirconium oxynitride layer.

The thickness of the second block insulating layer 15 in the y direction is, for example, equal to or more than 1 nm and equal to or less than 5 nm.

The barrier metal layer 19 is provided between the second block insulating layer 15 and the word line WL in the y direction. The barrier metal layer 19 is provided between the word line WL and the interlayer insulating layer 11 in the z direction. The barrier metal layer 19 is provided between the second block insulating layer 15 and the word line WL in the z direction.

The barrier metal layer 19 contains, for example, metal nitride. The barrier metal layer 19 contains, for example, at least one metal element selected from a group consisting of titanium (Ti), molybdenum (Mo), tungsten (W), and tantalum (Ta), and nitrogen (N).

The barrier metal layer 19 contains, for example, titanium nitride, molybdenum nitride, tungsten nitride, or tantalum nitride. The barrier metal layer 19 is, for example, a titanium nitride layer, a molybdenum nitride layer, a tungsten nitride layer, or a tantalum nitride layer.

The thickness of the barrier metal layer 19 in the y direction is, for example, equal to or more than 1 nm and equal to or less than 5 nm.

The core insulating region 20 is provided in the stacked body 30. The core insulating region 20 extends in the z direction. The core insulating region 20 is provided to penetrate the stacked body 30. The core insulating region 20 is surrounded by the semiconductor layer 10. The core insulating region 20 is surrounded by the plurality of word lines WL. The core insulating region 20 has a pillar shape. The core insulating region 20 has a columnar shape, for example.

The core insulating region 20 is, for example, an oxide, an oxynitride, or a nitride. The core insulating region 20 contains, for example, silicon (Si) and oxygen (O). The core insulating region 20 is, for example, silicon oxide.

The second block insulating layer 15 containing the second element, oxygen (O), and nitrogen (N) can be formed, for example, by thermally nitriding an oxide film containing the second element and oxygen (O). For example, when the second element is aluminum (Al), an aluminum oxide layer or an aluminum oxynitride layer containing nitrogen, which is an example of the second block insulating layer 15, can be formed by thermally nitriding an aluminum oxide film in an ammonia ($NH_3$) atmosphere.

The second block insulating layer 15 containing the second element, oxygen (O), and nitrogen (N) can be formed also by, for example, depositing a film containing the second element, oxygen (O), and nitrogen (N) by the CVD method. For example, when the second element is aluminum (Al), an aluminum oxide layer or an aluminum oxynitride layer containing nitrogen, which is an example of the second block insulating layer 15, can be formed by depositing an aluminum oxide film or an aluminum oxynitride film containing nitrogen by the CVD method.

The first block insulating layer 14 containing the first element, oxygen (O), and nitrogen (N) can be formed, for example, by thermally nitriding an oxide film containing the first element and oxygen (O). For example, when the first element is silicon (Si), a silicon oxide layer or a silicon oxynitride layer containing nitrogen, which is an example of the first block insulating layer 14, can be formed by thermally nitriding a silicon oxide film in an ammonia ($NH_3$) atmosphere.

The first block insulating layer 14 containing the first element, oxygen (O), and nitrogen (N) can be formed also by, for example, depositing a film containing the first element, oxygen (O), and nitrogen (N) by the CVD method. For example, when the first element is silicon (Si), a silicon oxide layer or a silicon oxynitride layer containing nitrogen, which is an example of the first block insulating layer 14, can be formed by depositing a silicon oxide film or a silicon oxynitride film containing nitrogen by the CVD method.

Next, functions and effects of the semiconductor memory device of the fourth embodiment will be described.

In the semiconductor memory device of the fourth embodiment, the second block insulating layer 15 contains the second element, oxygen (O), and nitrogen (N). In particular, since the second block insulating layer 15 contains nitrogen (N), diffusion of impurities from the word line WL side to the second block insulating layer 15 or the first block insulating layer 14 is suppressed.

Therefore, a leakage current between the charge storage layer 13 and the word line WL due to impurities is suppressed. This improves the charge retention characteristics of the semiconductor memory device.

From the viewpoint of improving charge retention characteristics, the first block insulating layer 14 preferably contains nitrogen (N).

As described above, according to the fourth embodiment, it is possible to provide a semiconductor memory device capable of improving charge retention characteristics.

In the first to fourth embodiments, the case where the interlayer insulating layer 11 is provided between the word lines WL has been described as an example, but the space between the word lines WL may be a cavity, for example.

In the first to fourth embodiments, the structure in which the semiconductor layer 10 is enclosed by the word line WL has been described as an example, but a structure in which the semiconductor layer 10 is held between the word lines WL divided into two can be adopted. In the case of this structure, the number of memory cells in the stacked body 30 can be two times.

In the first to fourth embodiments, the structure in which one memory hole 54 is provided with one semiconductor layer 10 has been described as an example, but a structure in which one memory hole 54 is provided with a plurality of semiconductor layers 10 divided into equal to or more than two can be adopted. In the case of this structure, the number of memory cells in the stacked body 30 can be equal to or more than two times.

In the first to fourth embodiments, the case where the charge storage layer is an insulating layer has been described as an example, but the charge storage layer may be a conductive layer.

While certain embodiments have been described, these embodiments have been presented by way of example only, and are not intended to limit the scope of the inventions. Indeed, the semiconductor memory device and the method for manufacturing the semiconductor memory device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a semiconductor layer extending in a first direction;
   a first gate electrode layer containing at least one element selected from a group consisting of molybdenum (Mo), tungsten (W), ruthenium (Ru), and cobalt (Co);
   a first insulating layer provided between the semiconductor layer and the first gate electrode layer;
   a charge storage layer provided between the first insulating layer and the first gate electrode layer, the charge storage layer extending in the first direction;
   a second insulating layer provided between the charge storage layer and the first gate electrode layer, the second insulating layer extending in the first direction;
   a third insulating layer including a first portion, a second portion, and a third portion, the first portion being provided between the second insulating layer and the first gate electrode layer; and
   a metal oxide layer provided between the third insulating layer and the gate electrode layer and containing a first metal element selected from a group consisting of titanium (Ti), molybdenum (Mo), tungsten (W), and tantalum (Ta),
   wherein the second portion and the third portion face in the first direction, and the first gate electrode layer is provided between the second portion and the third portion in the first direction.

2. The semiconductor memory device according to claim 1, further comprising a metal nitride layer provided between the metal oxide layer and the third insulating layer and containing a second metal element selected from a group consisting of titanium (Ti), molybdenum (Mo), tungsten (W), and tantalum (Ta).

3. The semiconductor memory device according to claim 1, further comprising a metal nitride layer provided between the metal oxide layer and the gate electrode layer and containing at least one second metal element selected from a group consisting of titanium (Ti), molybdenum (Mo), tungsten (W), and tantalum (Ta).

4. The semiconductor memory device according to claim 2, wherein the first metal element and the second metal element are a same element.

5. The semiconductor memory device according to claim 3, wherein the first metal element and the second metal element are a same element.

6. The semiconductor memory device according to claim 2, wherein a thickness of the metal nitride layer is thicker than a thickness of the metal oxide layer.

7. The semiconductor memory device according to claim 1, wherein the second insulating layer contains a first element and oxygen (O), and the third insulating layer contains a second element different from the first element and oxygen (O).

8. The semiconductor memory device according to claim 7, wherein the first element is silicon (Si), and the second element is aluminum (Al).

9. The semiconductor memory device according to claim 1, wherein the at least one element is molybdenum (Mo).

10. The semiconductor memory device according to claim 2, wherein the first metal element and the second metal element are titanium (Ti).

11. A semiconductor memory device, comprising:
    a semiconductor layer extending in a first direction;
    a first gate electrode layer containing molybdenum (Mo);
    a first insulating layer provided between the semiconductor layer and the gate electrode layer;
    a charge storage layer provided between the first insulating layer and the first gate electrode layer, the charge storage layer extending in the first direction;
    a second insulating layer provided between the charge storage layer and the first gate electrode layer and containing silicon (Si) and oxygen (O), the second insulating layer extending in the first direction; and
    a third insulating layer including a first portion, a second portion, and a third portion, the first portion being provided between the second insulating layer and the first gate electrode layer and containing aluminum (Al), oxygen (O), and nitrogen (N),
    wherein the second portion and the third portion face in the first direction, and the first gate electrode layer is provided between the second portion and the third portion in the first direction.

12. The semiconductor memory device according to claim 11, wherein the second insulating layer contains nitrogen (N).

13. The semiconductor memory device according to claim 1, further comprising:

a second gate electrode layer provided above the first gate electrode layer, the second gate electrode layer containing the at least one element; and
a fourth insulating layer provided between the first gate electrode layer and the second gate electrode layer,
wherein the charge storage layer is provided between the second insulating layer and the second gate electrode layer, and the second insulating layer is provided between the charge storage layer and the second gate electrode layer.

14. The semiconductor memory device according to claim 11, further comprising:
a second gate electrode layer provided above the first gate electrode layer, the second gate electrode layer containing the at least one element; and
a fourth insulating layer provided between the first gate electrode layer and the second gate electrode layer,
wherein the charge storage layer is provided between the second insulating layer and the second gate electrode layer, and the second insulating layer is provided between the charge storage layer and the second gate electrode layer.

* * * * *